(12) United States Patent
Kakiuchi

(10) Patent No.: US 11,515,464 B2
(45) Date of Patent: Nov. 29, 2022

(54) PIEZOELECTRIC ACTUATOR

(71) Applicant: Brother Kogyo Kabushiki Kaisha, Nagoya (JP)

(72) Inventor: Toru Kakiuchi, Aichi-ken (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 214 days.

(21) Appl. No.: 16/697,342

(22) Filed: Nov. 27, 2019

(65) Prior Publication Data

US 2020/0227620 A1 Jul. 16, 2020

(30) Foreign Application Priority Data

Jan. 10, 2019 (JP) .............................. JP2019-002324

(51) Int. Cl.
*H01L 41/09* (2006.01)
*H01L 41/083* (2006.01)
*H01L 41/047* (2006.01)
*B41J 2/14* (2006.01)

(52) U.S. Cl.
CPC .......... *H01L 41/09* (2013.01); *B41J 2/14209* (2013.01); *H01L 41/0471* (2013.01); *H01L 41/0831* (2013.01)

(58) Field of Classification Search
None
See application file for complete search history.

(56) References Cited

U.S. PATENT DOCUMENTS

| | | | |
|---|---|---|---|
| 8,585,188 B2 | 11/2013 | Ohta | |
| 2004/0046481 A1 | 3/2004 | Takeuchi et al. | |
| 2009/0026887 A1* | 1/2009 | Fujii | H01L 41/0973 310/365 |
| 2009/0244214 A1* | 10/2009 | Fujita | B41J 2/14233 347/71 |
| 2010/0231659 A1 | 9/2010 | Ohta | |
| 2013/0050353 A1 | 2/2013 | Ohta | |

FOREIGN PATENT DOCUMENTS

| | | |
|---|---|---|
| JP | 2010-214634 A | 9/2010 |
| JP | 2010-241080 A | 10/2010 |
| JP | 2010-284960 A | 12/2010 |
| JP | 2013-256137 A | 12/2013 |
| JP | 2013-256138 A | 12/2013 |
| WO | 02/073710 A1 | 9/2002 |

* cited by examiner

*Primary Examiner* — Erica S Lin
(74) *Attorney, Agent, or Firm* — Banner & Witcoff, Ltd.

(57) ABSTRACT

There is provided a piezoelectric actuator, including: a vibration plate; a first piezoelectric body; a second piezoelectric body; a first electrode disposed on a first surface of the first piezoelectric body; a second electrode disposed on a second surface of the second piezoelectric body; an intermediate electrode disposed on an intermediate surface of the first piezoelectric body and overlapping with the first and second electrodes; an intermediate trace connected to the intermediate electrode on the intermediate surface and drawn out to one side in a first direction beyond the first piezoelectric body and the second piezoelectric body; a first trace overlapping with the intermediate trace in the thickness direction and being conducted with the intermediate trace; and a second trace overlapping with the intermediate trace in the thickness direction and being conducted with the intermediate trace.

18 Claims, 18 Drawing Sheets

UP-DOWN DIRECTION

CONVEYANCE DIRECTION

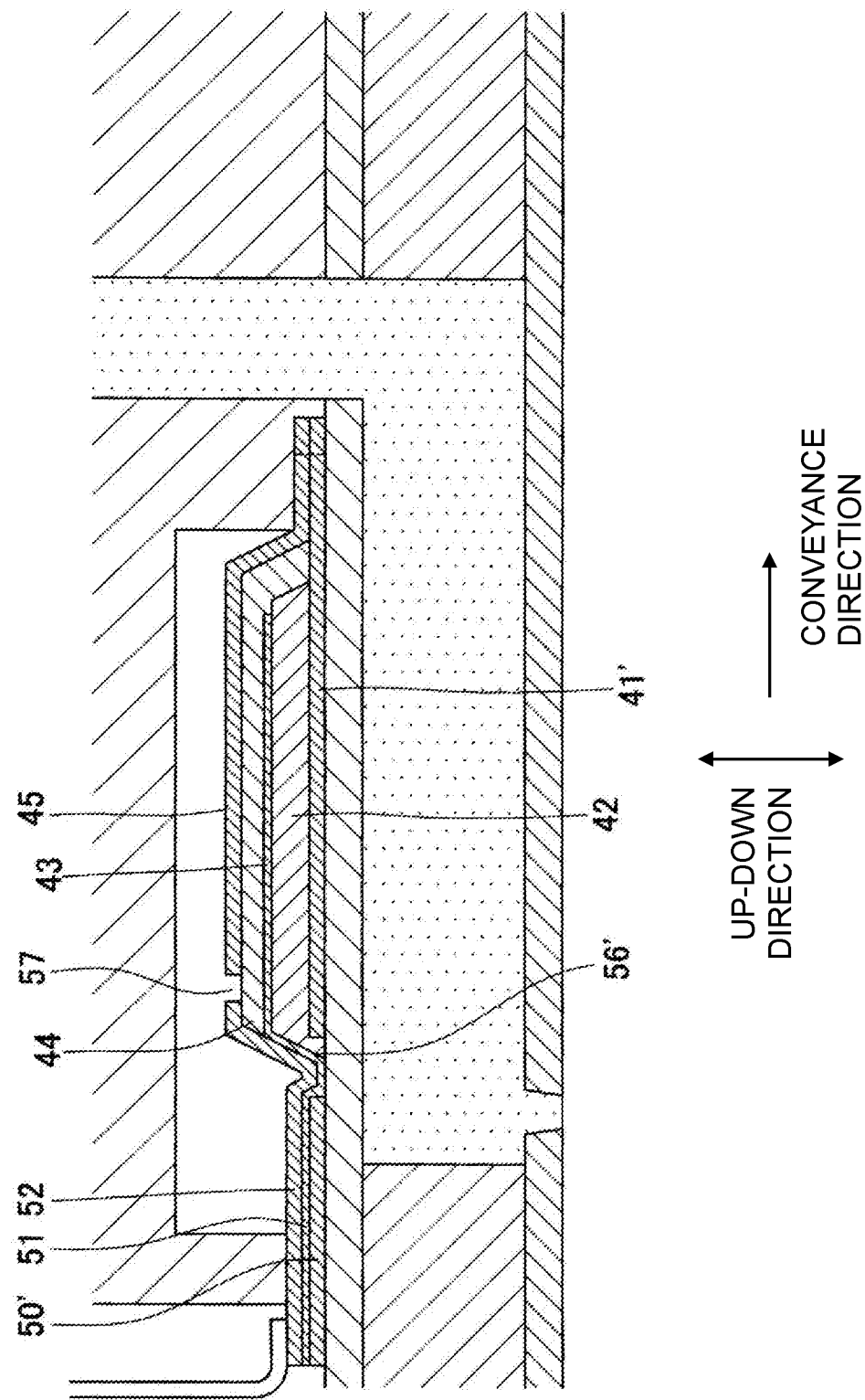

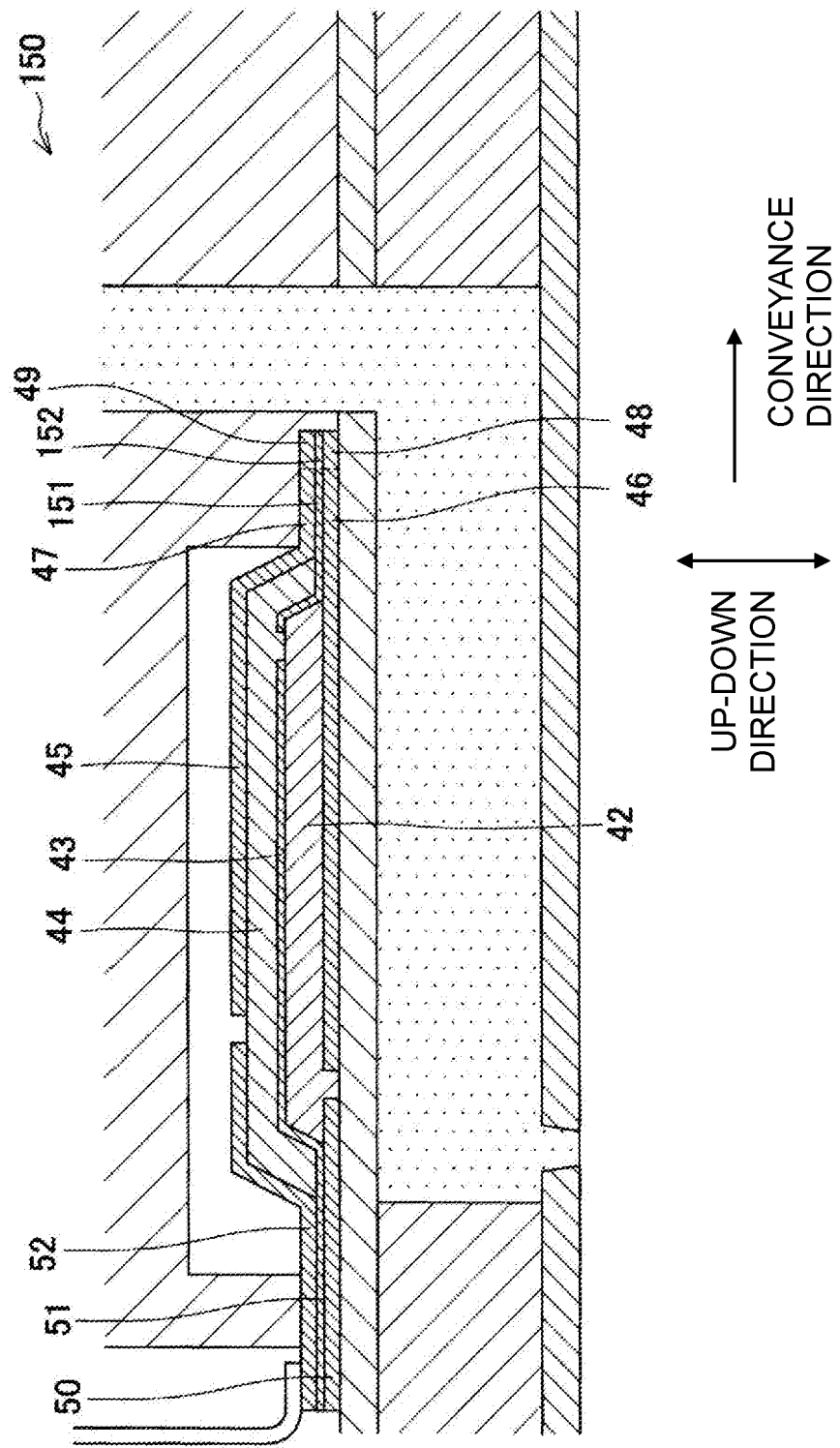

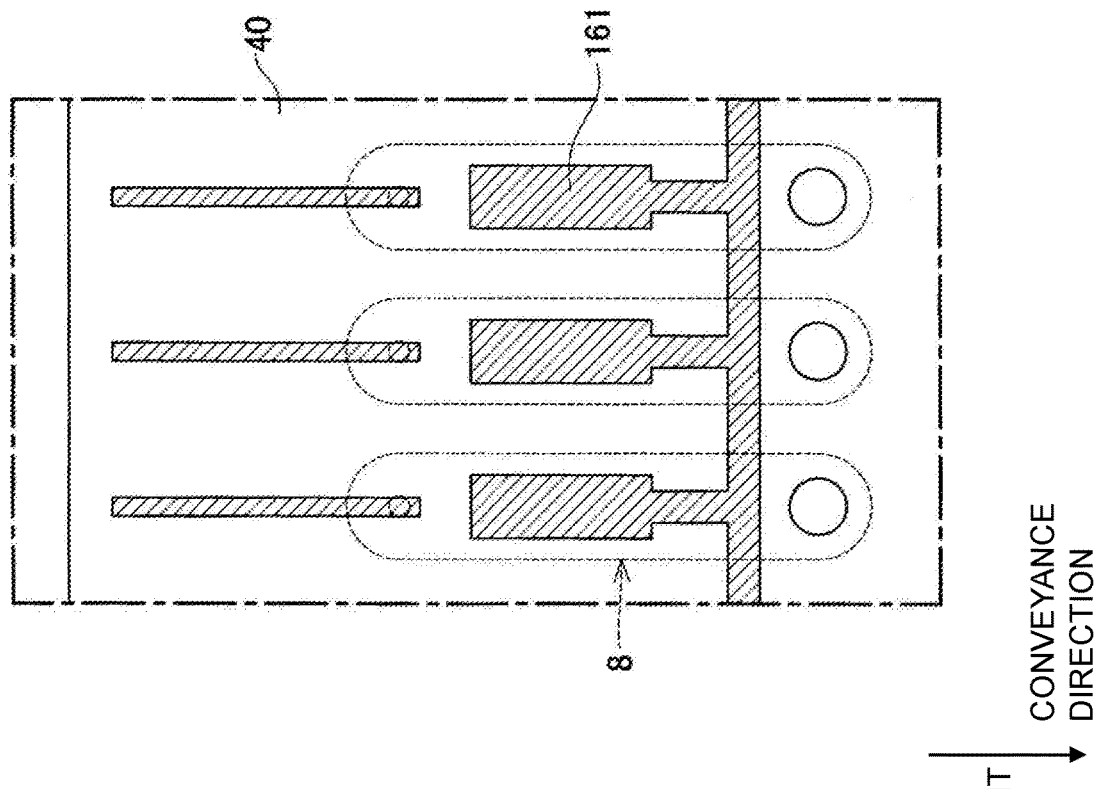
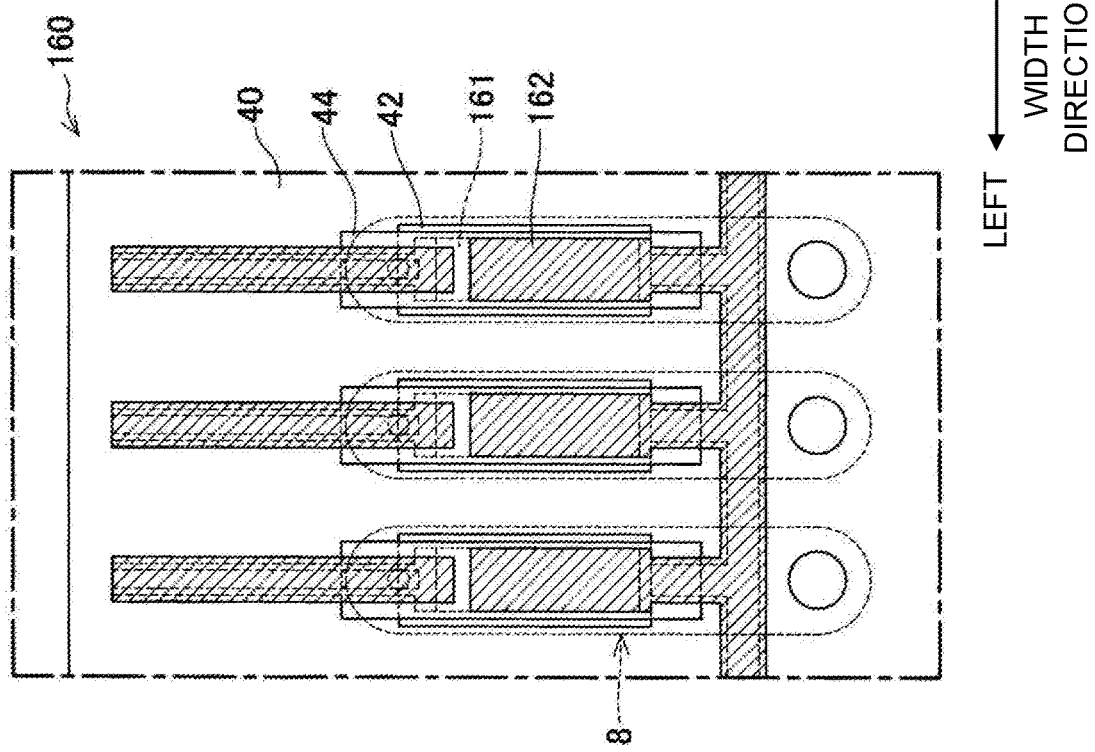

PIEZOELECTRIC ACTUATOR

CROSS REFERENCE TO RELATED APPLICATION

The present application claims priority from Japanese Patent Application No. 2019-002324 filed on Jan. 10, 2019, the disclosure of which is incorporated herein by reference in its entirety.

BACKGROUND

Field of the Invention

The present disclosure relates to a piezoelectric actuator.

Description of the Related Art

As a piezoelectric actuator, there is publicly known a piezoelectric element that applies pressure to ink in a pressure generation chamber. The publicly known piezoelectric element includes an elastic film, an insulating film, first piezoelectric layers, a second piezoelectric layer, a first common electrode, individual electrodes, and a second common electrode. The elastic film covers pressure chambers aligned in one direction. The insulating film is disposed on an upper surface of the elastic film so that the insulating film and the elastic film cover the pressure chambers. Each of the first piezoelectric layers is disposed at a portion included in an upper surface of the insulating film and overlapping in an up-down direction with the corresponding one of the pressure chambers. The second piezoelectric layer continuously extends over the first piezoelectric layers to cover the upper surface of the insulating film on which the first common electrode is disposed, upper surfaces of the first piezoelectric layers, and side surfaces in the one direction of the first piezoelectric layers. The first common electrode is disposed between the insulating film and the first piezoelectric layers to continuously extend over the first piezoelectric layers. The individual electrodes are disposed between the first piezoelectric layers and the second piezoelectric layer. The second common electrode is disposed on an upper surface of the second piezoelectric layer to continuously extend over portions overlapping in the up-down direction with the first piezoelectric layers.

In the above-described piezoelectric element, the portions of the first piezoelectric layers interposed between the first common electrode and the individual electrodes are active portions that are deformed piezoelectrically due to the difference in electric potential between the individual electrodes and the first common electrode. Further, portions of the second piezoelectric layer between the second common electrode and the individual electrodes are also active portions that are deformed piezoelectrically due to the difference in electric potential between the individual electrodes and the second common electrode. When the two active portions are deformed piezoelectrically, the elastic film and the portions of the insulating film and the first and second piezoelectric layers overlapping in the up-down direction with the pressure chambers are greatly deformed. This applies great pressure to ink in the pressure chambers.

In the above-described piezoelectric element, an end in a direction orthogonal to the up-down direction and the one direction of each individual electrode disposed on the upper surface of the first piezoelectric layer is exposed without covered with the second piezoelectric layer. A lead electrode is connected to an upper surface of the exposed portion of each individual electrode.

SUMMARY

In the above-described piezoelectric element, the exposed portion of each individual electrode is disposed on the upper surface of the first piezoelectric layer, and the lead electrode is connected to the exposed portion of each individual electrode. When the individual electrodes are formed, for example, a conductive material layer is formed and an unnecessary portion(s) is/are removed through etching. When the second piezoelectric layer is formed, for example, a piezoelectric material layer is formed and an unnecessary portion(s) is/are removed through etching. In order to form the exposed portion of each individual electrode on the upper surface of the first piezoelectric layer even when unevenness in etching is caused, the exposed portion of each individual electrode needs to have a relatively large size. This makes the piezoelectric element large. When the second piezoelectric layer is formed by performing etching on the piezoelectric material layer, part of the individual electrode may be removed by over-etching. This may cause a problem in which the individual electrode is not conducted with the lead electrode.

An object of the present disclosure is to provide a piezoelectric actuator that reliably allows an electrode to be conducted with a trace without making the piezoelectric actuator large.

According to an aspect of the present disclosure, there is provided a piezoelectric actuator, including: a vibration plate; a first piezoelectric body disposed at a side of the vibration plate in a thickness direction; a second piezoelectric body disposed at a side opposite to the vibration plate with respect to the first piezoelectric body in the thickness direction; a first electrode disposed on a first surface of the first piezoelectric body, the first surface facing the vibration plate in the thickness direction; a second electrode disposed on a second surface of the second piezoelectric body and overlapping in the thickness direction with the first electrode, the second surface being at an opposite side of the first piezoelectric body in the thickness direction, an intermediate electrode disposed on an intermediate surface of the first piezoelectric body and overlapping in the thickness direction with the first and second electrodes, the intermediate surface facing the second piezoelectric body in the thickness direction, an intermediate trace portion connected to the intermediate electrode on the intermediate surface and drawn out to the first side in a first direction, which is orthogonal to the thickness direction, beyond the first piezoelectric body and the second piezoelectric body; a first trace portion disposed at the first side in the first direction with respect to the first piezoelectric body and the second piezoelectric body, overlapping with the intermediate trace portion at the other side in the thickness direction, and being conducted with the intermediate trace portion; and a second trace portion disposed at the first side in the first direction with respect to the first piezoelectric body and the second piezoelectric body, overlapping with the intermediate trace portion at the side in the thickness direction, and being conducted with the intermediate trace portion.

BRIEF DESCRIPTION OF THE DRAWINGS

FIG. 11 depicts a case in which an end at a lower electrode 41 side of an individual trace portion 50 does not overlap with the first piezoelectric body 42 in an up-down direction, and FIG. 11 corresponds to FIG. 6.

FIG. 17 depicts a head unit 150 and corresponds to FIG. 6.

FIG. 18A depicts a head unit 160 and corresponds to FIG. 3; and FIG. 18B depicts the head unit 160 and corresponds to FIG. 4B.

DESCRIPTION OF THE EMBODIMENTS

An embodiment of the present disclosure is explained below.

<Schematic Configuration of Printer 1>

Figure 1:
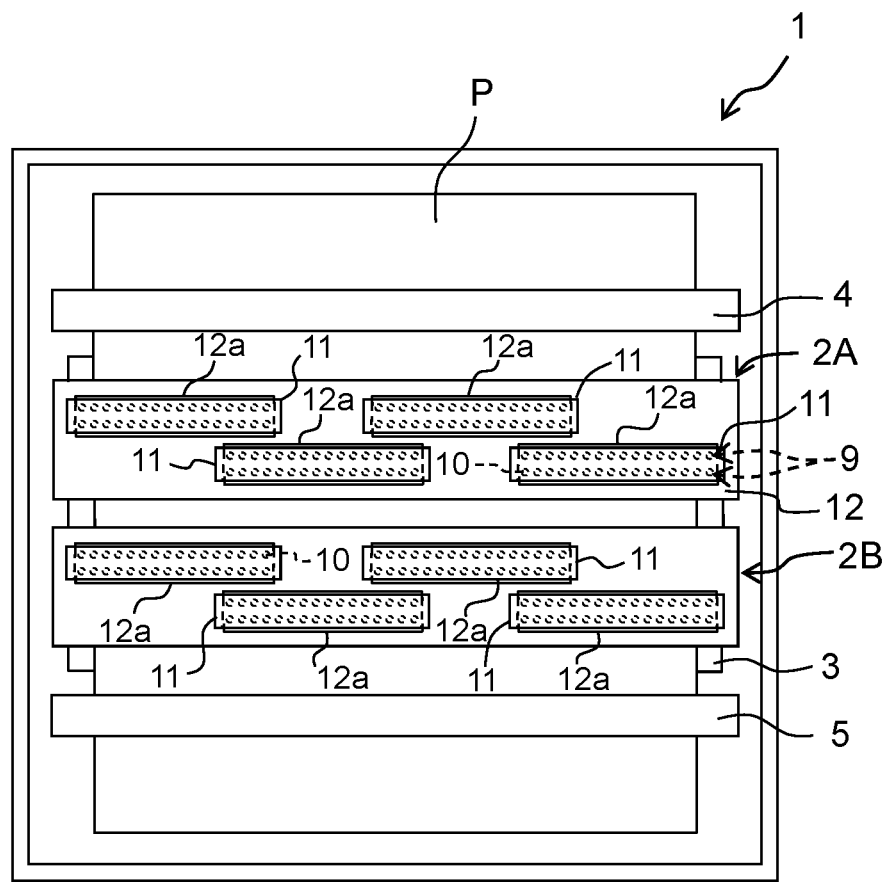
FIG. 1 schematically depicts a configuration of a printer 1.

As depicted in FIG. 1, a printer 1 according to the first embodiment includes two ink-jet heads 2A and 2B, a platen 3, and conveyance rollers 4 and 5. The ink-jet head 2A and the ink-jet head 2B are arranged in a conveyance direction in which a recording sheet P is conveyed. The ink-jet head 2B is disposed downstream of the ink-jet head 2A in the conveyance direction. Each of the ink-jet heads 2A and 2B includes four head units 11 and a holding member 12.

The head unit 11 includes nozzles 10 that are open in a lower surface thereof. The nozzles 10 are aligned in a width direction of a sheet (herein after referred to "a width direction"), which is orthogonal to the conveyance direction, to form a nozzle row 9. The head unit 11 includes two nozzle rows 9 arranged in the conveyance direction. The positions in the width direction of the nozzles 10 belonging to one of the nozzle rows 9 are the same as those belonging to the other. The following explanation is made by defining the right and the left in the width direction as indicated in FIG. 1.

In each head unit 11 of the ink-jet head 2A, a black ink is discharged from the nozzles 10 forming the nozzle row 9 included in the two nozzle rows 9 and disposed at an upstream side in the conveyance direction, and a yellow ink is discharged from the nozzles 10 forming the nozzle row 9 disposed at a downstream side in the conveyance direction. In each head unit 11 of the ink-jet head 2B, a cyan ink is discharged from the nozzles 10 forming the nozzle row 9 included in the two nozzle rows 9 and disposed at the upstream side in the conveyance direction, and a magenta ink is discharged from the nozzles 10 forming the nozzle row 9 disposed at the downstream side in the conveyance direction.

In the following, although the ink-jet head 2A is explained as an example, the ink-jet head 2B has the same configuration. In the ink-jet head 2A, two of the four head units 11 are arranged in the width direction at an interval. Similarly, the remaining two of the four head units 11 are arranged in the width direction at an interval. The two head units 11 and the remaining two head units 11 arranged in the width direction are arranged in the conveyance direction at an interval. The positions in the width direction of the two head units 11 arranged at the upstream side in the conveyance direction are shifted from those of the two head units 11 disposed at the downstream side in the conveyance direction. Part of the nozzles 10 of the head units 11 disposed at the upstream side in the conveyance direction overlap in the conveyance direction with part of the nozzles 10 of the head units 11 disposed at the downstream side in the conveyance direction. This allows the nozzles 10 of the four head units 11 to extend over an entire length in the width direction of the recording sheet P. Namely, the ink-jet head 2A is a so-called line head extending over the entire length in the width direction of the recording sheet P.

The holding member 12 is a rectangular plate-like member extending over the entire length in the width direction of the recording sheet P. The holding member 12 has four through holes 12a corresponding to the four respective head units 11. The nozzles 10 of each of the heads 11 are exposed to a lower side (a recording sheet P side) via the corresponding one of the through holes 12a.

The platen 3 is disposed below the ink-jet heads 2A and 2B to face the nozzles 10 of the ink-jet heads 2A and 2B. The platen 3 supports the recording sheet P from below.

The conveyance roller 4 is disposed upstream of the ink-jet heads 2A, 2B and the platen 3 in the conveyance direction. The conveyance roller 5 is disposed downstream of the ink-jet heads 2A, 2B and the platen 3 in the conveyance direction. The conveyance rollers 4 and 5 convey the recording sheet P in the conveyance direction.

The printer 1 performs recording on the recording sheet P by discharging ink from the nozzles 10 of the ink-jet heads 2A, 2B onto the recording sheet P while conveying the sheet P in the conveyance direction by use of the conveyance rollers 4, 5.

<Head Units 11>

Subsequently, the head units 11 are explained. As depicted in FIGS. 2 to 6, each head unit 11 includes a nozzle plate 31, a channel substrate 32, two piezoelectric actuators 33, and a protective substrate 34.

The nozzle plate 31 is made using a synthetic resin material, such as polyimide. The nozzle plate 31 includes the nozzles 10 forming the two nozzle rows 9.

The channel substrate 32, which is made using Silicon (Si), is disposed on an upper surface of the nozzle plate 31. The channel substrate 32 includes pressure chambers 30. The pressure chambers 30 correspond to the respective nozzles 10. The longitudinal direction of the pressure chamber 30 is the conveyance direction. An end at a first side in the conveyance direction of each of the pressure chambers 30 overlaps in the up-down direction with the corresponding one of the nozzles 10. The nozzle plate 31 thus includes the pressure chambers 30 aligned in the width direction. This forms two pressure chamber rows 8 arranged in the conveyance direction.

The wording "at a first side in the conveyance direction" herein means the upstream side in the conveyance direction when the configuration of the pressure chamber row 8 disposed at the upstream side in the conveyance direction is explained, and means the downstream side in the conveyance direction when the configuration of the pressure chamber row 8 disposed at the downstream side in the conveyance direction is explained.

The two piezoelectric actuators 33 correspond to the two respective pressure chamber rows 8. The two piezoelectric actuators 33 are disposed on an upper surface of the channel substrate 32. Each piezoelectric actuator 33 includes a vibration plate 40, a lower electrode 41 (corresponding to a first electrode of the present disclosure), first piezoelectric bodies 42, intermediate electrodes 43, second piezoelectric bodies 44, an upper electrode 45 (corresponding to a second electrode of the present disclosure), common trace portions 46 and 47, two coupling trace portions 48 and 49, and individual trace portions 50 to 52.

The vibration plate 40 is common to the two piezoelectric actuators 33. The vibration plate 40 is made using silicon dioxide (SiO2), silicon nitride (SiN), or the like. The vibration film 40 covers the pressure chambers 30 forming the two pressure chamber rows 8. The vibration film 40 is formed by oxidizing or nitriding an upper end of the channel substrate 32. The thickness of the vibration plate 40 is, for example approximately 1 to 2 μm.

The lower electrode 41 is made using, for example, platinum (Pt). The lower electrode 41 is disposed on an upper surface of the vibration plate 40 (corresponding to a first surface of the present disclosure). The lower electrode 41 continuously extends over the pressure chambers 30 forming the pressure chamber rows 8.

The first piezoelectric bodies 42 are made using a piezoelectric material of which primary constituent is lead zirconate titanate, which is a mixed crystalline of lead zirconate and lead titanate. The first piezoelectric bodies 42 are formed corresponding to the respective pressure chambers 30. Each of the first piezoelectric bodies 42 is disposed at a portion included in the upper surface (at one side in a thickness direction) of the vibration plate 40 on which the lower electrode 41 is disposed and overlapping in the up-down direction with the corresponding one of the pressure chambers 30. The first piezoelectric bodies 42 are thus aligned in the width direction similar to the pressure chambers 30. The thickness of the first piezoelectric bodies is, for example, approximately 1 μm.

Figure 5:
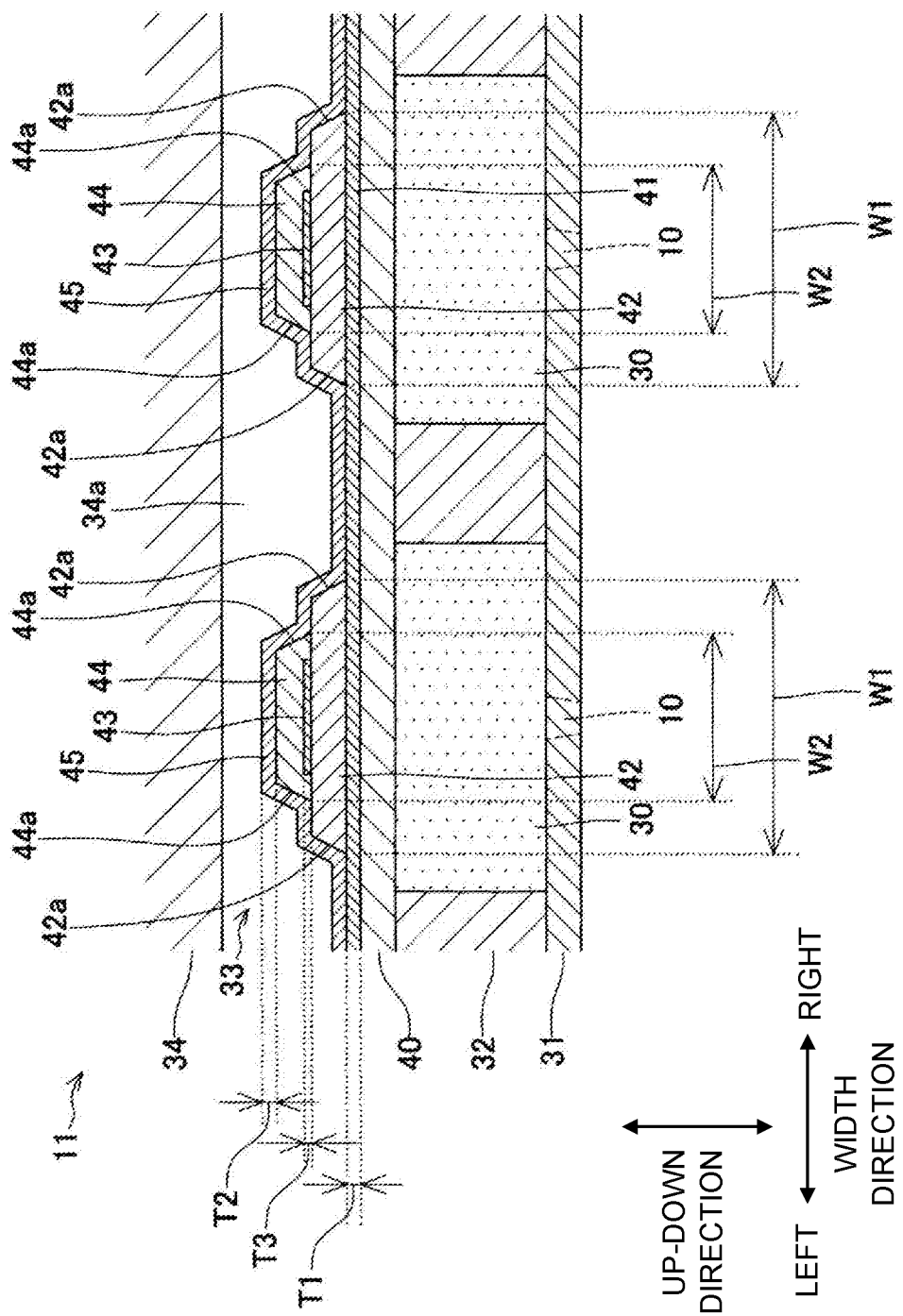
FIG. 5 is a cross-sectional view of the head unit 11 taken along a line V-V in FIG. 3.
Figure 6:
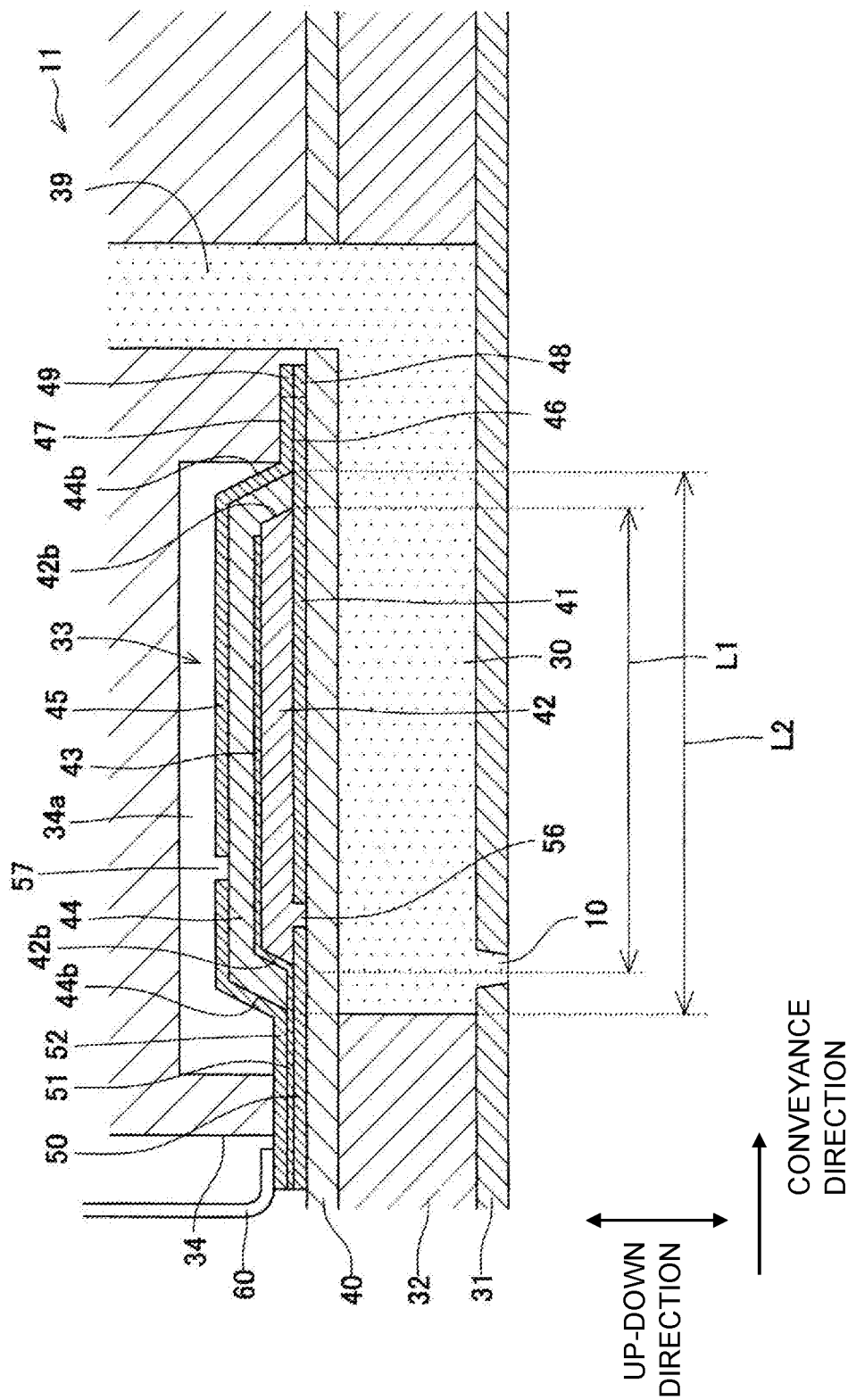
FIG. 6 is a cross-sectional view of the head unit 11 taken along a line VI-VI in FIG. 3.

As depicted in FIG. 5, end surfaces 42a in the width direction of the first piezoelectric body 42 are inclined to the up-down direction so that its upper side is closer to the inside in the width direction of the first piezoelectric body 42 than its lower side. As depicted in FIG. 6, end surfaces 42b in the conveyance direction of the first piezoelectric body 42 are inclined to the up-down direction so that its upper side is closer to the inside in the conveyance direction of the first piezoelectric body 42 than its lower side.

The intermediate electrodes 43 are made using, for example, platinum (Pt) or iridium (Ir). The intermediate electrodes 43 correspond to the respective first piezoelectric bodies 42. Each of the intermediate electrodes 43 is disposed on an upper surface of the corresponding one of the first piezoelectric bodies 42 (corresponding to an intermediate surface of the present disclosure). Each intermediate electrode 43 is drawn out to the first side in the conveyance direction and extends to an end at the first side in the conveyance direction of the channel substrate 32.

The second piezoelectric bodies 44 are made using the above piezoelectric material. The second piezoelectric bodies 44 correspond to the respective first piezoelectric bodies 42. Each of the second piezoelectric bodies 44 is disposed on the upper surface (the opposite side of the vibration plate 40) of the corresponding one of the first piezoelectric bodies 42 on which the intermediate electrode 43 is disposed. The second piezoelectric bodies 44 are thus aligned in the width direction similar to the pressure chambers 30 and the first piezoelectric bodies 42. The thickness of the second piezoelectric bodies 44 is substantially the same as that of the first piezoelectric bodies 42, which is, for example, approximately 1 μm.

As depicted in FIG. 5, the end surfaces 44a in the width direction of the second piezoelectric body 44 are inclined to the up-down direction so that its upper side is closer to the inside in the width direction of the second piezoelectric body 44 than its lower side. As depicted in FIG. 6, end surfaces 44b in the conveyance direction of the second piezoelectric body 44 are inclined to the up-down direction so that its upper side is closer to the inside in the conveyance direction of the second piezoelectric body 44 than its lower side.

As depicted in FIG. 5, a length W2 in the width direction of the second piezoelectric body 44 is shorter than a length W1 in the width direction of the first piezoelectric body 42. The both ends in the width direction of the second piezoelectric body 44 are positioned between the both ends in the width direction of the first piezoelectric body 42. Namely, a right end of the first piezoelectric body 42 is positioned on the right of a right end of the second piezoelectric body 44 in the width direction, and a left end of the first piezoelectric body 42 is positioned on the left of a left end of the second piezoelectric body 44 in the width direction. In the first embodiment, the end surfaces 42a in the width direction of the first piezoelectric body 42 are not covered with the second piezoelectric body 44. The length W1 of the first piezoelectric body 42 is, for example, approximately 40 to 50 The length W2 of the second piezoelectric body 44 is, for example, approximately 30 to 40 µm.

As depicted in FIG. 6, a length L2 of the second piezoelectric body 44 is longer than a length L1 of the first piezoelectric body 42 in the conveyance direction. The end surfaces 42b in the conveyance direction of the first piezoelectric body 42 are covered with the second piezoelectric body 44. The length L1 in the conveyance direction of the first piezoelectric body 42 is, for example, approximately 400 to 500 The length L1 in the conveyance direction is longer than the length W1 in the width direction. The length L2 in the conveyance direction of the second piezoelectric body 44 is, for example, approximately 500 to 600 The length L2 in the conveyance direction is longer than the length W2 in the width direction.

The upper electrode 45 is made using, for example, platinum (Pt) or iridium (Ir). The upper electrode 45 extends over the second piezoelectric bodies 44 in the width direction. The upper electrode 45 covers upper surfaces (corresponding to a second surface of the present disclosure) of the second piezoelectric bodies 44, the end surfaces 44a in the width direction of the second piezoelectric bodies 44, portions included in the upper surfaces of the first piezoelectric bodies 42 and extending beyond the second piezoelectric bodies 44 in the width direction, and the end surfaces 42a in the width direction of the first piezoelectric bodies 42.

In this embodiment, as depicted in FIG. 5, a thickness T3 of the intermediate electrode 43 is smaller than a thickness T1 of the lower electrode 41 and a thickness T2 of the upper electrode 45. For example, the thickness T1 of the lower electrode 41 and the thickness T2 of the upper electrode 45 are not less than 0.1 µm and less than 0.2 µm. The thickness T3 of the intermediate electrode 43 is not less than 0.05 µm and less than 0.1 µm.

A second side in the conveyance direction herein means the downstream side in the conveyance direction when the configuration of the pressure chamber row 8 disposed at the upstream side in the conveyance direction is explained, and means the upstream side in the conveyance direction when the configuration of the pressure chamber row 8 disposed at the downstream side in the conveyance direction is explained.

Figure 4:
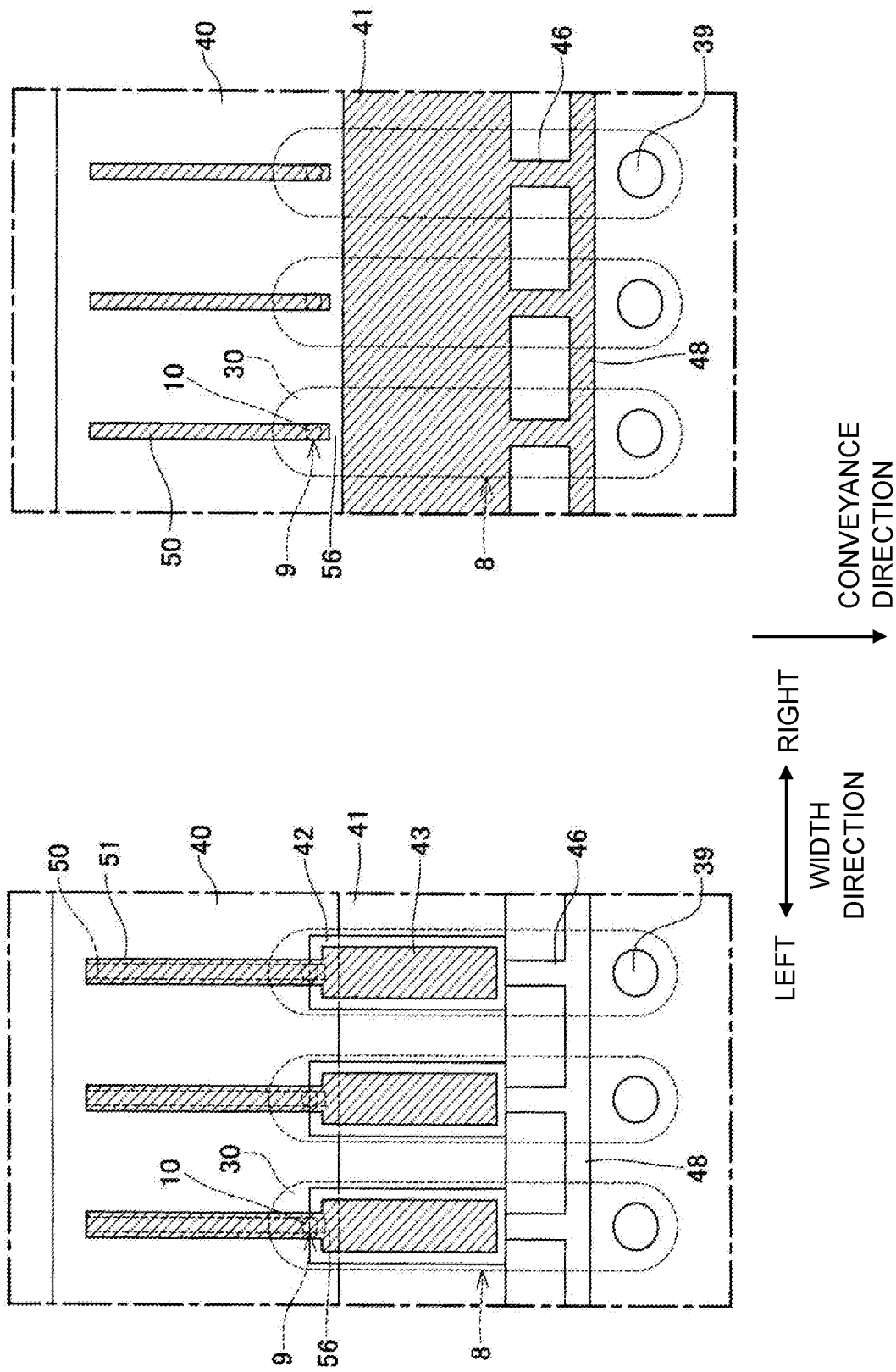
FIG. 4A depicts a configuration in which second piezoelectric bodies 44, an upper electrode 45, common trace portions 46, a coupling trace portion 48, and individual trace portions 52 are removed from the configuration in FIG. 3.
FIG. 4B depicts a configuration in which first piezoelectric bodies 42, intermediate electrodes 43, and individual trace portions 51 are removed from the configuration in FIG. 4A.

The common trace portions 46 (corresponding to a third trace of the present disclosure) correspond to the respective pressure chambers 30. As depicted in FIG. 4, the common trace portions 46 are disposed on the upper surface of the vibration plate 40 and connected to portions included in an end at the second side in the conveyance direction of the lower electrode 41 and overlapping in the up-down direction with center portions in the width direction of the first piezoelectric bodies 42. Each common trace portion 46 extends from the connection portion with the lower electrode 41 toward the second side in the conveyance direction. The common trace portions 46 may not correspond to the respective pressure chambers 30, and only some of the common trace portions 46 may be provided.

Figure 3:
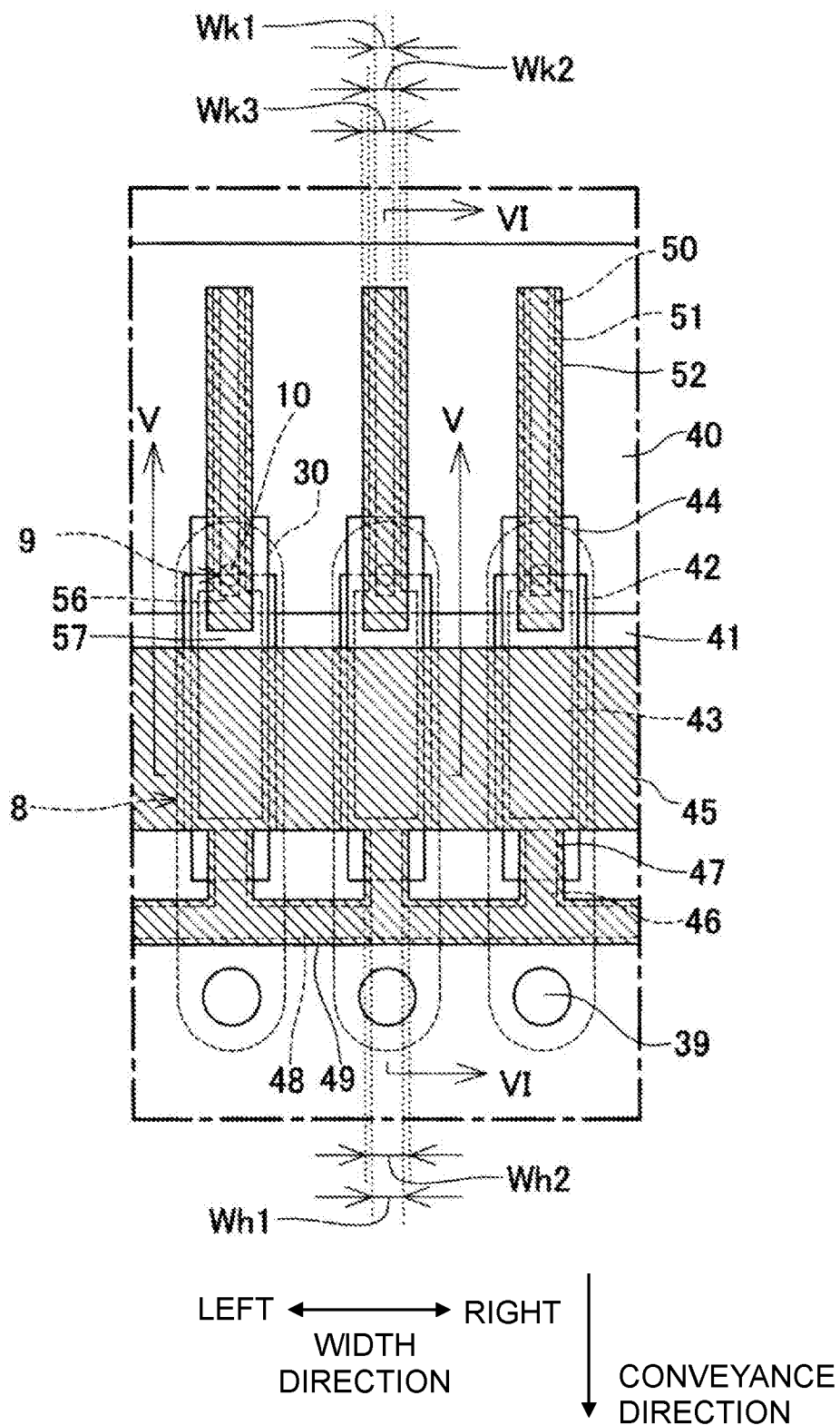
FIG. 3 is an enlarged view of a portion III in FIG. 2.

Common trace portions 47 (corresponding to a fourth trace of the present disclosure) correspond to the respective common trace portions 46. For example, as depicted in FIGS. 3 and 6, the common trace portions 47 are disposed on the upper surfaces of the second piezoelectric bodies 44 and connected to portions included in an end at the second side in the conveyance direction of the upper electrode 45 and overlapping in the up-down direction with center portions in the width direction of the respective pressure chambers 30. Each trace portion 47 extends from the connection portion with the upper electrode 45 toward the second side in the conveyance direction so that each trace portion 47 extends beyond the first piezoelectric body 42 and the second piezoelectric body 44 to reach the upper surface of the vibration plate 40. Each of the common trace portions 47 disposed on the upper surface of the vibration plate 40 overlaps in the up-down direction with the corresponding one of the common trace portions 46 and conducted therewith.

As depicted in FIG. 3, a length Wh2 in the width direction of the common trace portion 47 is longer than a length Wh1 in the width direction of the common trace portion 46. The both ends in the width direction of the common trace portion 46 are positioned between the both ends in the width direction of the common trace portion 47. Namely, a right end of the common trace portion 47 is positioned on the right of a right end of the common trace portion 46 in the width direction, and a left end of the common trace portion 47 is positioned on the left of a left end of the common trace portion 46 in the width direction.

Figure 2:
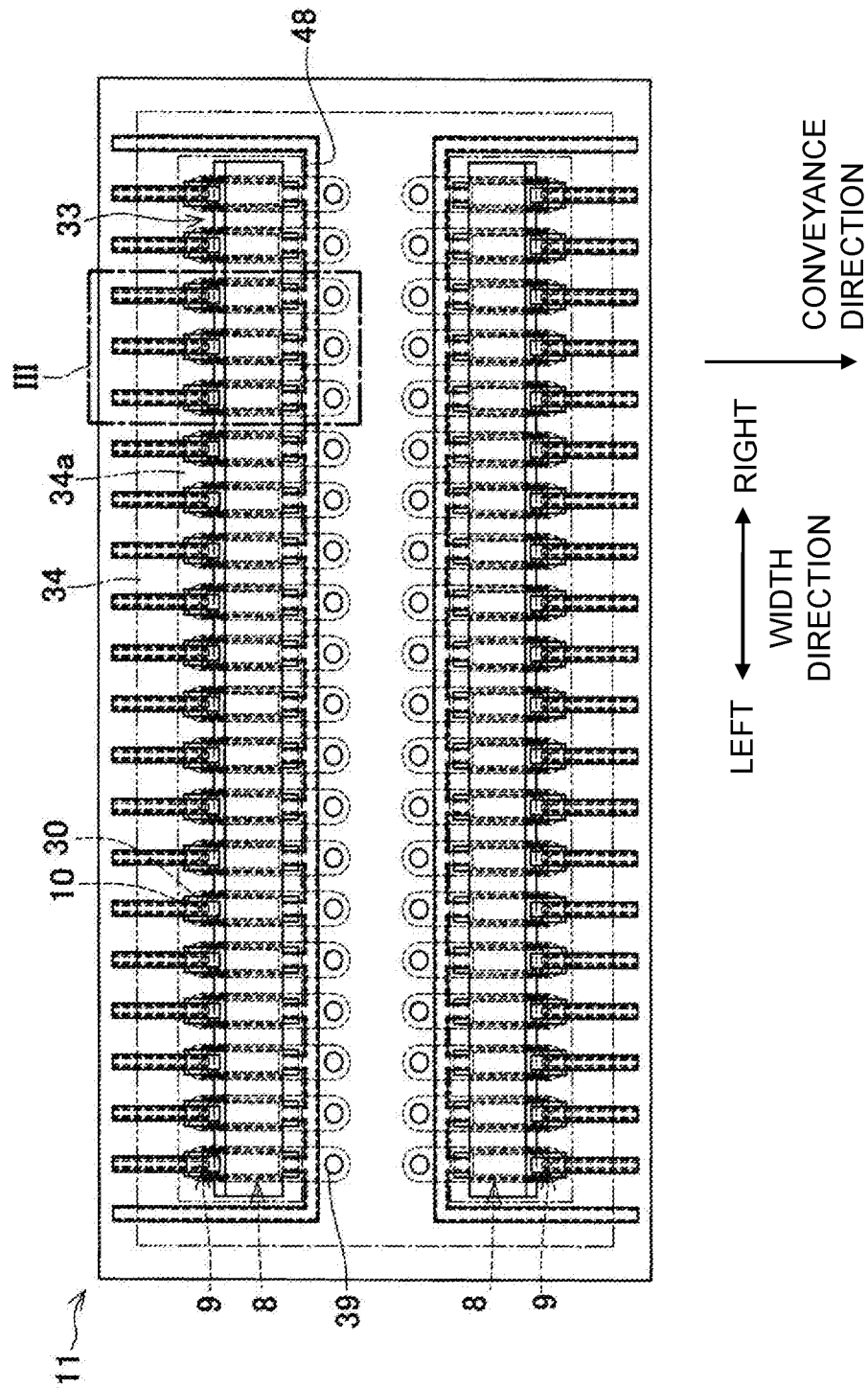
FIG. 2 is a plan view of a head unit 11.

The coupling trace portion 48 is formed integrally with the common trace portions 46. The coupling trace portion 48 extends in the width direction to connect ends of the common trace portions 46 positioned on the opposite side of the lower electrode 41 in the conveyance direction. Further, as depicted in FIG. 2, the coupling trace portion 48 is bent at both ends in the width direction to extend toward the first side in the conveyance direction and reach an end at the first side in the conveyance direction of the vibration plate 40.

The coupling trace portion 49 is formed integrally with the common trace portions 47. For example, as depicted in FIGS. 3 and 6, the coupling trace portion 49 extends in the width direction to connect ends of the common trace portions 47 positioned on the opposite side of the upper electrode 45 in the conveyance direction. The coupling trace portion 49 is bent at both ends in the width direction to extend toward the first side in the conveyance direction and reach the end at the first side in the conveyance direction of the vibration plate 40. Arranging the coupling trace portion 49 as described above allows the coupling trace portions 48 and 49 to overlap with each other in the up-down direction on the upper surface of the vibration plate 40. The coupling trace portion 48 is conducted with the coupling trace portion 49.

In this embodiment, instead of providing the lower electrode 41, the common trace portions 46, and the coupling trace portion 48, one electrode continuously extending over areas where the lower electrode 41, the common trace portions 46, and the coupling trace portion 48 are arranged may be provided. In that configuration, part of the one electrode corresponding to the lower electrode 41 corresponds to the first electrode of the present disclosure, and part of the one electrode corresponding to the common trace portion 46 corresponds to the third trace portion of the present disclosure.

In this embodiment, instead of providing the upper electrode 45, the common trace portions 47, and the coupling trace portion 49, one electrode continuously extending over areas where the upper electrode 45, the common trace portions 47, and the coupling trace portion 49 are arranged may be provided. In that configuration, part of the one electrode corresponding to the upper electrode 45 corresponds to the second electrode of the present disclosure, and part of the one electrode corresponding to the common trace portion 47 corresponds to the fourth trace portion of the present disclosure.

Individual trace portions 50 (corresponding to a first trace of the present disclosure) correspond to the respective pressure chambers 30. Each individual trace portion 50 is disposed on the upper surface of the vibration plate 40 at a portion overlapping with the end at the first side in the conveyance direction of the pressure chamber 30. Each individual trace portion 50 is positioned on the upper surface of the vibration plate 40 at the first side in the conveyance direction from the lower electrode 41 and extends toward the end at the first side in the conveyance direction of the vibration plate 40.

Each individual trace portion 50 is separated from the lower electrode 41 by a slit 56 (corresponding to a first slit of the present disclosure) extending in the width direction. Namely, a conductive body (corresponding to a first conductive body of the present disclosure) including portions that become the lower electrode 41, the common trace portions 46, the coupling trace portion 48, and the individual trace portions 50 is disposed on the upper surface of the vibration plate 40. Each slit 56 divides the conductive body into a portion that becomes the individual trace portion 50 and a portion that becomes the lower electrode 41, the common trace portion 46, and the coupling trace portion 48. Each slit 56 is disposed in a range where the first piezoelectric body 42 is disposed in the conveyance direction, which allows an end of the individual trace portion 50 at a lower electrode 41 side in the conveyance direction to overlap with the first piezoelectric body 42.

Individual trace portions 51 (corresponding to an intermediate trace of the present disclosure) correspond to the respective pressure chambers 30. Each individual trace portion 51 is disposed on the upper surface of the first piezoelectric body 42 and connected to an end at the first side in the conveyance direction of the intermediate electrode 43. Each individual trace portion 51 extends from the connection portion with the intermediate electrode 43 toward the first side in the conveyance direction so that each individual trace portion 51 extends beyond the first piezoelectric body 42 and the second piezoelectric body 44 to reach the upper surface of the vibration plate 40. Each of the individual trace portions 51 disposed on the upper surface of the vibration plate 40 overlaps in the up-down direction with the corresponding one of the individual trace portions 50 and conducted therewith.

A length Wk2 in the width direction of the individual trace portion 51 is longer than a length Wk1 in the width direction of the individual trace portion 50. The both ends in the width direction of the individual trace portion 50 are positioned between the both ends in the width direction of the individual trace portion 51. Namely, a right end of the individual trace portion 51 is positioned on the right of a right end of the individual trace portion 50 in the width direction. A left end of the individual trace portion 51 is positioned on the left of a left end of the individual trace portion 50 in the width direction.

As depicted in FIG. 6, individual trace portions 52 (corresponding to a second trace of the present disclosure) correspond to the respective pressure chambers 30. Each individual trace portion 52 is disposed on the upper surface of the second piezoelectric body 44 at a portion overlapping with the end at the first side in the conveyance direction of the pressure chamber 30. Each individual trace portion 52 is positioned at the first side in the conveyance direction from the upper electrode 45. Each individual trace portion 52 extends toward the first side in the conveyance direction from the upper surface of the second piezoelectric body 44 to the upper surface of the vibration plate 40 so that each individual trace portion 52 extends beyond the first piezoelectric body 42 and the second piezoelectric body 44. The individual trace portion 52 disposed on the upper surface of the vibration plate 40 overlaps in the up-down direction with the individual trace portions 50 and 51 and conducted therewith.

A length Wk3 in the width direction of the individual trace portion 52 is longer than the lengths Wk1 and Wk2 in the width direction of the individual trace portions 50 and 51. The both ends in the width direction of the individual trace portion 51 are positioned between the both ends in the width direction of the individual trace portion 52. Namely, a right end of the individual trace portion 52 is positioned on the right of a right end of the individual trace portion 51 in the width direction. A left end of the individual trace portion 52 is positioned on the left of a left end of the individual trace portion 51 in the width direction.

Each individual trace portion 52 on the upper surface of the second piezoelectric body 44 is separated from the upper electrode 45 by a slit 57 (corresponding to a second slit of the present disclosure) extending in the width direction. Namely, a conductive body (corresponding to a second conductive body of the present disclosure) including the upper electrode 45, part of the common trace portion 47, and part of the individual trace portion 52 is disposed on the upper surface of each second piezoelectric body 44. Each slit 57 divides the conductive body into a portion that becomes the individual trace portion 52 and a portion that becomes the upper electrode 45 and the common trace portion 47.

In the conveyance direction, the center of the slit 57 is positioned at the second side (positioned inside the second piezoelectric body 44) from the center of the slit 56. In that configuration, a length in the conveyance direction of a portion of the first piezoelectric body 42 interposed between the lower electrode 41 and the intermediate electrode 43 is longer than a length in the conveyance direction of a portion of the second piezoelectric body 44 interposed between the upper electrode 45 and the intermediate electrode 43.

The protective substrate 34 is made using silicon (Si). The protective substrate 34 is disposed on the upper surface of the channel substrate 32 on which the piezoelectric actuators 33 are disposed. The protective substrate 34 has two recesses 34a that are open in its lower surface. The two recesses 34a correspond to the two pressure chamber rows 8. The two recesses 34a extend in the width direction to cover the first piezoelectric bodies 42 and the second piezoelectric bodies 44 corresponding to the pressure chambers 30 forming the pressure chamber rows 8.

The head unit 11 includes supply channels 39. The supply channels 39 correspond to the pressure chambers 30. Each supply channel 39 extends in the up-down direction at a portion overlapping in the up-down direction with an end at the second side in the conveyance direction of each pressure chamber 30 to pass through the vibration plate 40, the lower electrode 41, and the upper electrode 45. A lower end of each supply channel 39 is connected to each pressure chamber 30. An upper end of each supply channel 39 is connected to a manifold (not depicted). Ink is supplied from the manifold to the pressure chambers 30 via the respective supply channels 39.

In this embodiment, as depicted in FIGS. 2 and 6, the vibration plate 40 extends toward the first side in the conveyance direction beyond the protective substrate 34. At the end at the first side in the conveyance direction of the upper surface of the vibration plate 40, a front end of a trace formed by overlapping the coupling trace portion 48 with the coupling trace portion 49 in the up-down direction and a front end of a trace formed by causing the individual trace portions 50 to 52 to overlap with each other in the up-down direction are arranged in the width direction. A trace member 60 is joined to the end at the first side in the conveyance direction of the upper surface of the vibration plate 40. This causes the intermediate electrodes 43 to be connected to a driver IC (note depicted) via the trace member 60. The driver IC selectively applies any of a ground potential and a predefined driving potential (e.g., approximately 20V) to the respective intermediate electrodes 43. The lower electrode 41 and the upper electrode 45 are connected to a power source (not depicted) via the trace member 60 and kept at the ground potential.

A method for discharging ink from the nozzles 10 by driving the piezoelectric actuators 33 is explained below. In the piezoelectric actuators 33, the electric potential of all the intermediate electrodes 43 is kept at the ground potential that is the same as the lower electrode 41 and the upper electrode 45. When ink is discharged from a certain nozzle 10, the electric potential of the intermediate electrode 43 corresponding to the certain nozzle 10 is switched from the ground potential to the predefined driving potential. This generates an electrical field in the thickness direction in an active portion of the first piezoelectric body 42 interposed between the lower electrode 41 and the intermediate electrode 43 and an electrical field in the thickness direction in an active portion of the second piezoelectric body 44 interposed between the intermediate electrode 43 and the upper electrode 45. These electrical fields cause piezoelectric deformation of the active portions of the first and second piezoelectric bodies 42, 44, which causes the active portions to contract in a horizontal direction. This deforms the vibration plate 40 and the portions of the first and second piezoelectric bodies 42, 44 that overlap in the up-down direction with the pressure chamber 30 so that they are convex toward the pressure chamber 30 side as a whole. This makes the volume of the pressure chamber 30 small, the pressure of ink in the pressure chamber 30 increases, and ink is discharged from the nozzle 10 communicating with the pressure chamber 30. After ink is discharged from the nozzle 10, the electric potential of the intermediate electrode 43 returns to the ground potential.

<Method of Manufacturing Head Unit 11>

Subsequently, a method of manufacturing the head unit 11 including the piezoelectric actuators 33 is explained below. Although the head unit 11 is not installed in the printer 1 during the manufacturing process of the head unit 11, for the purpose of convenience, the following explanation is made by defining directions corresponding to a width direction, a conveyance direction, and an up-down direction of the head unit 11 during manufacture as the width direction, the conveyance direction, and the up-down direction as described above.

Figure 7A:
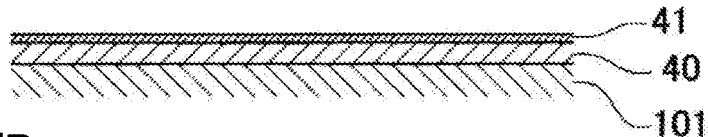
FIG. 7A illustrates a step of forming a lower electrode 41 and corresponds to part of FIG. 5.
Figure 8A:
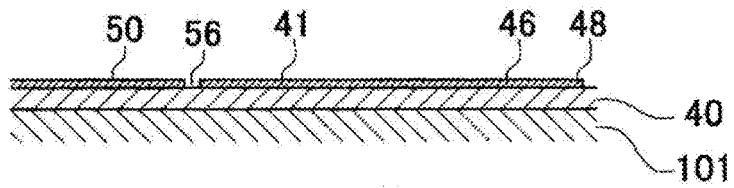
FIG. 8A illustrates a step of forming the lower electrode 41 and corresponds to part of FIG. 6.

As depicted in FIGS. 7A and 8A, when the head unit 11 is manufactured, the lower electrode 41, the common trace portions 46, the coupling trace portion 48, and the individual trace portions 50 are formed on the upper surface of the vibration plate 40, which is formed by oxidizing or nitriding an upper surface of a substrate 101. The substrate 101 becomes the channel substrate 32. A conductive material film (corresponding to the first conductive body of the present disclosure) is formed over the entirety of the upper surface of the vibration plate 40, and unnecessary portions of the conductive material film are removed through etching to form the slits 56, and the like. Accordingly, the lower electrode 41, the common trace portions 46, the coupling trace portion 48, and the individual trace portions 50 are formed.

Figure 7B:
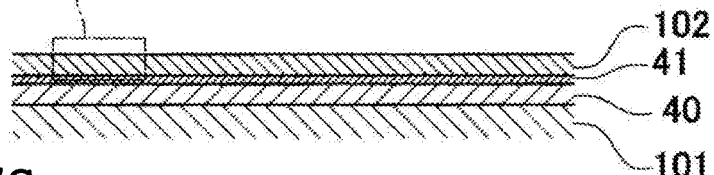
FIG. 7B illustrates a step of forming a first layer 101 and corresponds to part of FIG. 5.
Figure 8B:
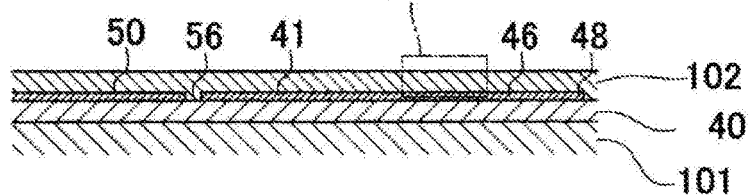
FIG. 8B illustrates a step of forming the first layer 101 and corresponds to part of FIG. 6.

Subsequently, as depicted in FIGS. 7B and 8B, a first layer 102 is formed by a sol-gel method on the upper surface of the vibration plate 40 on which the lower electrode 41 is disposed. The first layer 102 is a piezoelectric material layer to be formed as the first piezoelectric bodies 42. The first layer 102 covers the vibration plate 40 and the lower electrode 41. Application of the piezoelectric material is performed by spin coating. Formation of the first layer 102 and the second layer 103 through the sol-gel method is explained below in detail.

Figure 7C:
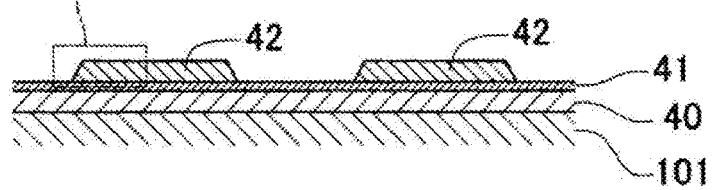
FIG. 7C illustrates a step of forming the first piezoelectric bodies 42 by etching and corresponds to part of FIG. 5.
Figure 7D:
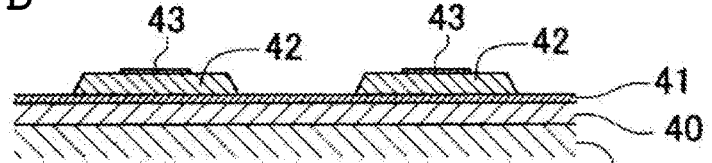
FIG. 7D illustrates a step of forming the intermediate electrodes 43 and corresponds to part of FIG. 5.
Figure 8C:
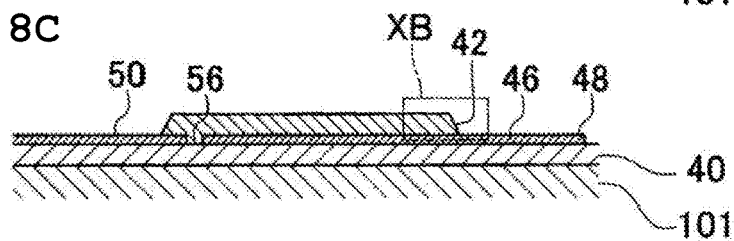
FIG. 8C illustrates a step of forming the first piezoelectric body 42 by etching and corresponds to part of FIG. 6.
Figure 8D:
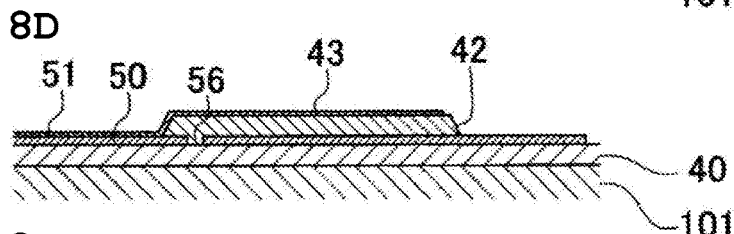
FIG. 8D illustrates a step of forming the intermediate electrode 43 and corresponds to part of FIG. 6.

Subsequently, as depicted in FIGS. 7C and 8C, the first piezoelectric bodies 42 are formed by performing etching on the first layer 102. Next, as depicted in FIGS. 7D and 8D, the intermediate electrodes 43 and the individual trace portions 51 are formed on the upper surfaces of the first piezoelectric bodies 42 and the vibration plate 40.

Figure 7E:
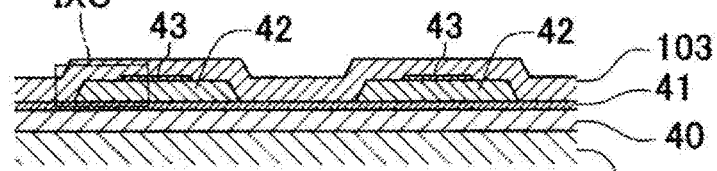
FIG. 7E illustrates a step of forming a second layer 102 and corresponds to part of FIG. 5.
Figure 7F:
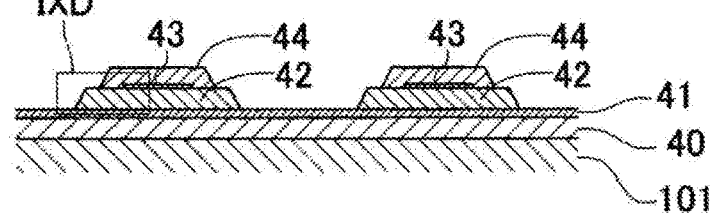
FIG. 7F illustrates a step of forming the second piezoelectric bodies 44 and corresponds to part of FIG. 5.
Figure 8E:
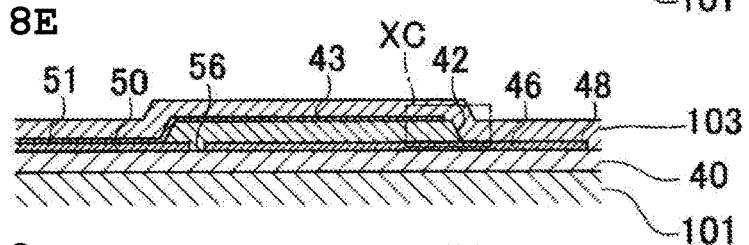
FIG. 8E illustrates a step of forming the second layer 102 and corresponds to part of FIG. 6.
Figure 8F:
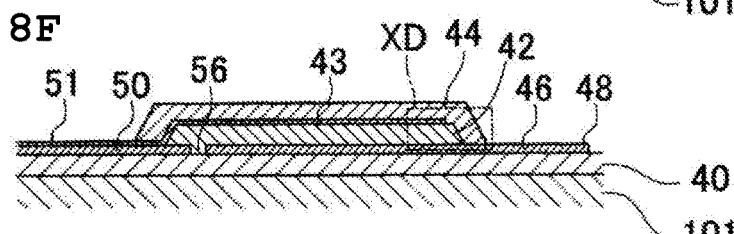
FIG. 8F illustrates a step of forming the second piezoelectric body 44 and corresponds to part of FIG. 6.

Subsequently, as depicted in FIGS. 7E and 8E, a second layer 103 is formed by a sol-gel method on the upper surface of the vibration plate 40 on which the lower electrode 41 and the first piezoelectric bodies 42 are disposed. The second layer 103 is a piezoelectric material layer to be formed as the second piezoelectric bodies 44. The second layer 103 covers the vibration plate 40, the lower electrode 41, the first piezoelectric bodies 42, and the intermediate electrodes 43. Application of the piezoelectric material is performed by spin coating. Next, as depicted in FIGS. 7F and 8F, the second piezoelectric bodies 44 are formed by performing etching on the second layer 103.

Figure 7G:
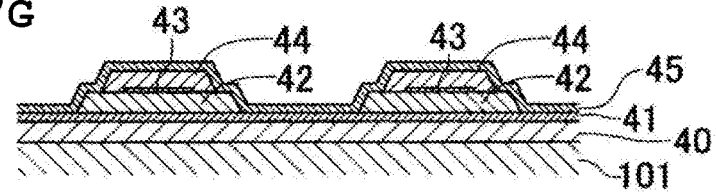
FIG. 7G illustrates a step of forming the upper electrode 45 and corresponds to part of FIG. 5.
Figure 8G:
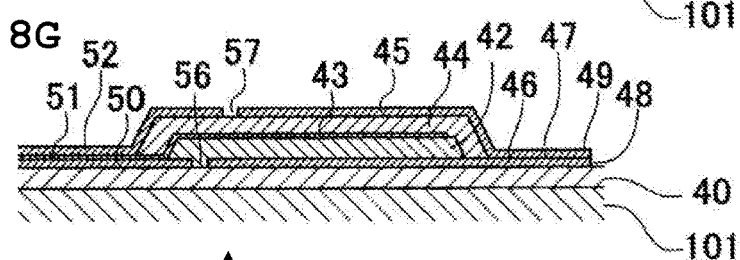
FIG. 8G illustrates a step of forming the upper electrode 45 and corresponds to part of FIG. 6.

Subsequently, As depicted in FIGS. 7G and 8G, the upper electrode 45, the coupling trace portions 47, the coupling trace portion 49, and the individual trace portions 50 are formed on upper surfaces of stacked bodies of the first piezoelectric bodies 42 and the second piezoelectric bodies 44 and the vibration plate 40. Conductive material films (corresponding to the second conductive body of the present disclosure) are formed over the entireties of upper surfaces of the stacked bodies, and unnecessary portions of the conductive material films are removed through etching to form the slits 57, and the like. Accordingly, the upper electrode 45, the common trace portions 47, the coupling trace portion 49, and the individual trace portions 52 are formed.

The formation of the piezoelectric actuators 33 are completed through the above steps. After that, the protective substrate 34 is joined to the upper surface of the substrate 101. The pressure chambers 30 and the like are formed on the substrate 101 through etching so that the substrate 101 is formed as the channel substrate 32. The nozzle plate 31 manufactured separately is joined to a lower surface of the channel substrate 32. Accordingly, the head unit 11 is completed.

<Formation of First Layer 102 and Second Layer 103 by Sol-Gel Method>

Subsequently, formation of the first layer 102 and the second layer 103 by a sol-gel method is explained below. In this embodiment, when the piezoelectric material layer is formed by the sol-gel method, a thin film of the piezoelectric material is formed by applying the piezoelectric material by spin coating. Repeating the formation of the thin film of the piezoelectric material results in laminated thin films of the piezoelectric material (corresponding to a piezoelectric thin film of the present disclosure). The first layer 102 and the second layer 103 are thus formed.

The piezoelectric material is baked every time a predefined number of thin films of the piezoelectric material are laminated. A lamination boundary 111 is formed in the first layer 102 at a portion corresponding to an upper surface of the thin film of the piezoelectric material positioned uppermost in baking. Similarly, a lamination boundary 112 is formed in the second layer 103 at a portion corresponding to an upper surface of the thin film of the piezoelectric material positioned uppermost in baking.

As described above, the first layer 102 is formed on the upper surface of the vibration plate 40 on which the lower electrode 41 is disposed. Since the upper surface is a flat surface parallel to the width direction and the conveyance direction, the thin film forming the first layer 102 extends parallelly to the width direction and the conveyance direction.

Figure 9A:
FIG. 9A is an enlarged view of a portion IXA in FIG. 7B.
Figure 9B:
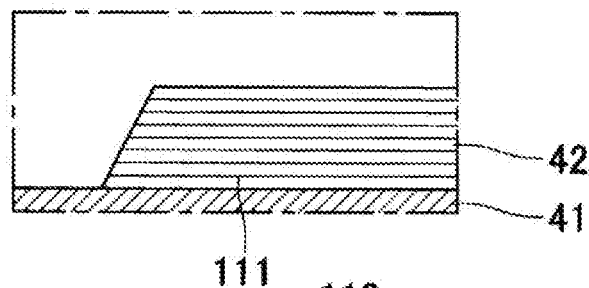
FIG. 9B is an enlarged view of a portion IXB of FIG. 7C.
Figure 10A:
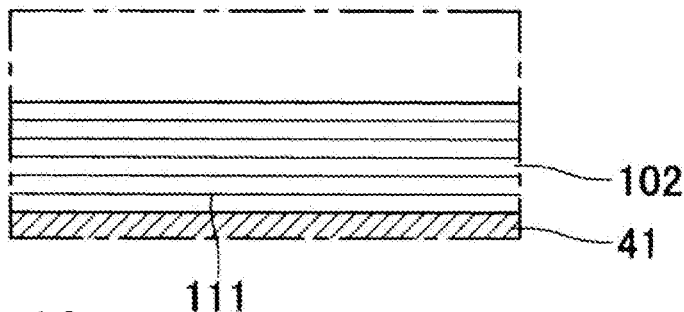
FIG. 10A is an enlarged view of a portion XA in FIG. 8B.
Figure 10B:
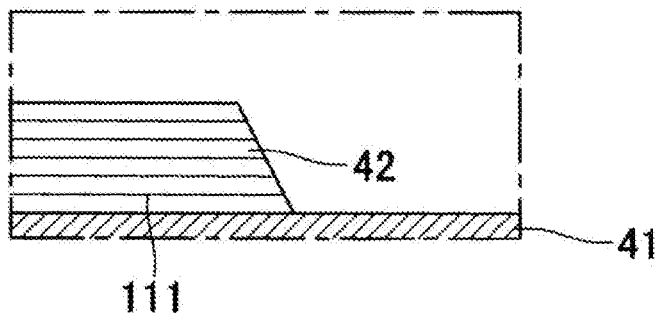
FIG. 10B is an enlarged view of a portion XB of FIG. 8C.

The lamination boundary 111 in the first layer 102 thus extends in the width direction and the conveyance direction, as depicted in FIGS. 9A and 10A. The lamination boundary 111 thus extends in the width direction and the conveyance direction also in the piezoelectric body 42 formed by performing etching on the first layer 102, as depicted in FIGS. 9B and 10B.

The second layer 103 is formed on the upper surface of the vibration plate 40 on which the lower electrode 41 and the first piezoelectric body 42 are disposed. The upper surface is a surface having irregularities, namely having a portion with the first piezoelectric body 42 and a portion without the first piezoelectric body 42.

Figure 9C:
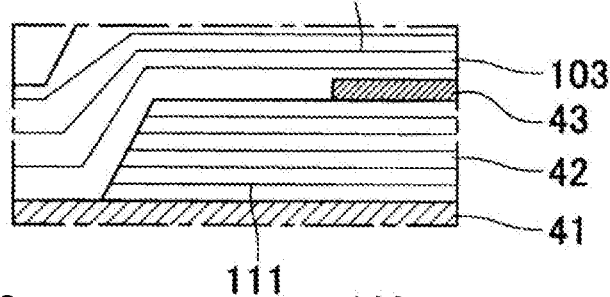
FIG. 9C is an enlarged view of a portion IXC of FIG. 7E.
Figure 10C:
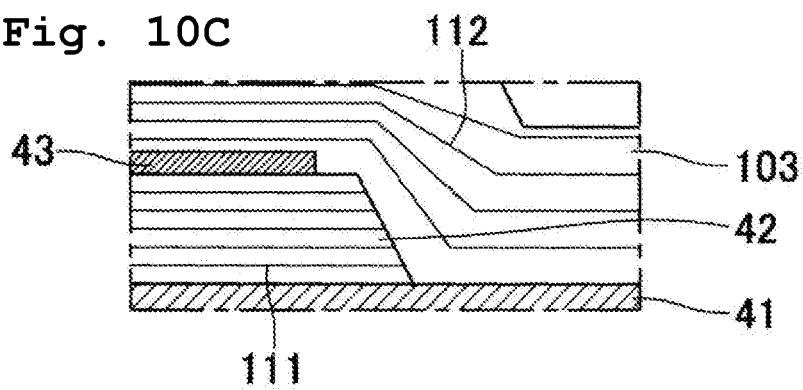
FIG. 10C is an enlarged view of a portion XC of FIG. 8E.

The lamination boundary 112 in the second layer 103 thus extends in the width direction and the conveyance direction at a portion covering the upper surface of the first piezoelectric body 42 and a portion covering the lower electrode 41, as depicted in FIGS. 9C and 10C. The lamination boundary 112 in the second layer 103 extends in a direction inclined to the width direction at a portion covering the end surface 42a of the first piezoelectric body 42. The lamination boundary 112 in the second layer 103 extends in a direction inclined to the conveyance direction at a portion covering the end surface 42b of the first piezoelectric body 42.

Figure 9D:
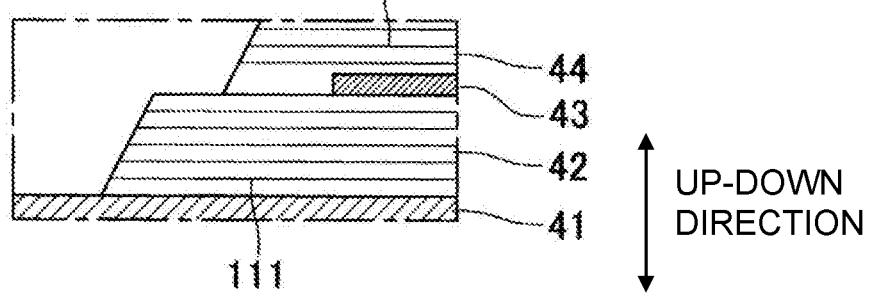
FIG. 9D is an enlarged view of a portion IXD of FIG. 7F.
Figure 10D:
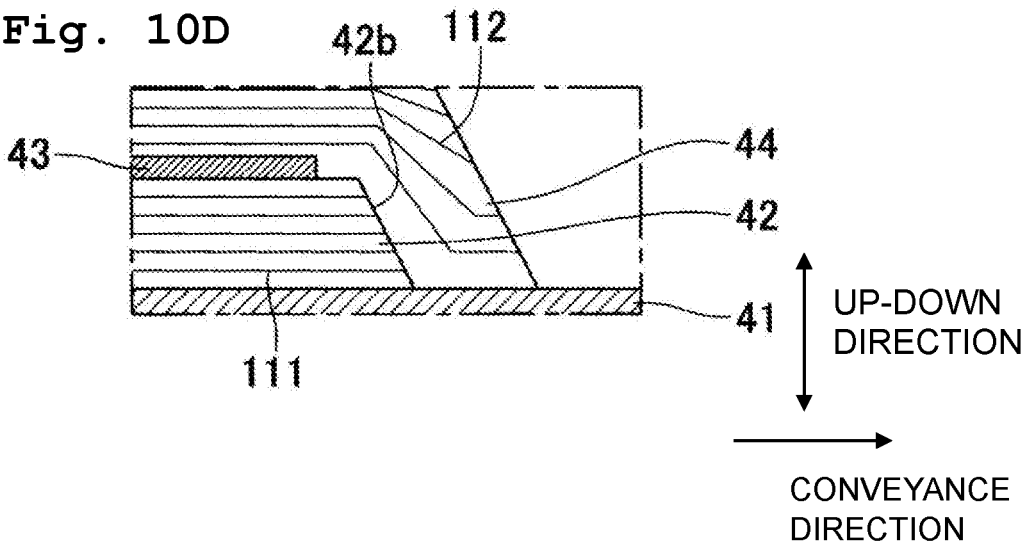
FIG. 10D is an enlarged view of a portion XD of FIG. 8F.

The lamination boundary 112 in the second piezoelectric body 44 formed by performing etching on the second layer 103 thus extends in the width direction and the conveyance direction at a portion covering the upper surface of the first piezoelectric body 42, and extends in a direction inclined to the conveyance direction at a portion covering the end surface 42b of the first piezoelectric body 42, as depicted in FIGS. 9D and 10D. The portion of the second layer 103 covering the end surface 42a of the first piezoelectric body 42 is removed in the following step, and the second piezoelectric body 44 has no portion covering the end surface 42a of the first piezoelectric body 42.

<Effects>

In the above embodiment, the individual trace portions 51 connected to the intermediate electrodes 43 overlap in the up-down direction with the individual trace portions 50 and 52 and are conducted therewith. The thickness of the trace connected to each intermediate electrode 43 is thus a thickness obtained by summing up the thicknesses of the three individual trace portions 50 to 52. Thus, if part of the individual electrodes 50 to 52 is removed by over-etching during the formation of the first piezoelectric bodies 42 through the etching as depicted in FIGS. 7C and 8C, the formation of the second piezoelectric bodies 42 through the etching as depicted in FIGS. 7F and 8F, and the like, it is possible to inhibit the disconnection of the trace formed by the individual trace portions 50 to 52 and to reliably provide the conduction between the intermediate electrodes 43 and the traces.

As depicted in FIGS. 7A and 8A, the individual trace portions 50 are formed in parallel with the lower electrode 41. As depicted in FIGS. 7D and 8D, the individual trace portions 51 are formed in parallel with the intermediate electrodes 43. As depicted in FIGS. 7G and 8G, the individual trace portions 52 are formed in parallel with the upper electrode 45. Thus, the first piezoelectric bodies 42 are not required to have exposed portions of the intermediate electrodes 43 and the individual trace portions 51 for connection of the traces. This inhibits the piezoelectric actuator 33 from having a large size.

In the piezoelectric actuator 33 of this embodiment, the length L1 of the first piezoelectric body 42 and the length L2 of the second piezoelectric body 44 in the conveyance direction are longer than the length W1 of the first piezoelectric body 42 and the length W2 of the second piezoelectric body 44 in width direction. When the piezoelectric actuator 33 is driven, the deformation of the piezoelectric actuator 33 in the conveyance direction is greater than that in the width direction. Thus, unlike this embodiment, if the trace portions are drawn out in the width direction, the deformation of the piezoelectric actuator 33 at the time of driving would be greatly obstructed. Further, the first piezoelectric bodies 42 and the second piezoelectric bodies 44 are arranged in the width direction at short intervals in this embodiment. Thus, unlike this embodiment, if the trace portions are drawn out in the width direction, the trace portions would interfere with the first piezoelectric bodies 42 and the second piezoelectric bodies 44.

In this embodiment, the trace portions are drawn out in the conveyance direction. This inhibits the deformation of the piezoelectric actuator 33 at the time of driving from being obstructed, compared to the configuration in which the trace portions are drawn out in the width direction. Further, it is possible to inhibit the trace portions from interfering with the first piezoelectric bodies 42 and the second piezoelectric bodies 44.

In this embodiment, the lower electrode 41 and the upper electrode 45 are constant potential electrodes in which the electric potential is kept at the ground potential. The intermediate electrodes 43 are driving electrodes in which the electric potential is switched between the ground potential and the driving potential. Switching the electric potential of the intermediate electrode 43 causes the piezoelectric deformation of the portion of the first piezoelectric body 42 interposed between the lower electrode 41 and the intermediate electrode 43 and the piezoelectric deformation of the portion of the second piezoelectric body 44 interposed between the upper electrode 45 and the intermediate electrode 43. This greatly deforms the vibration plate 40, the first piezoelectric body 42, and the second piezoelectric body 44.

More specifically, the piezoelectric actuator 33 of this embodiment is compared with a piezoelectric actuator (hereinafter referred to as a piezoelectric actuator 33') in which a piezoelectric body having a thickness that corresponds to the total of thicknesses of the first piezoelectric body 42 and the second piezoelectric body 44 is provided instead of the first piezoelectric bodies 42 and the second piezoelectric bodies 44 and electrodes are disposed on both surfaces in the up-down direction of the one piezoelectric body. When the piezoelectric actuators 33 and 33' have the same difference in electric potential generated in the electrodes sandwiching each piezoelectric body therebetween, the strength or magnitude of the electrical field generated in the first piezoelectric body 42 and the second piezoelectric body 44 of the piezoelectric actuator 33 is approximately twice the electrical field generated in the piezoelectric body of the piezoelectric actuator 33'. In the piezoelectric actuator, the deformation amount of the piezoelectric body and the vibration plate is larger as the electric field generated in the piezoelectric body is larger. The deformation of the piezoelectric bodies and the vibration plate in the piezoelectric actuator 33 is thus larger than the piezoelectric actuator 33'.

In this embodiment, the lower electrode 41 and the individual trace portions 50 are disposed on the upper surface of the vibration plate 40. In that configuration, the lower electrode 41 and the individual trace portions 50 that are not conducted with each other are easily formed by forming the conductive bodies on the upper surface of the vibration plate 40 and then forming the slits 56.

In this embodiment, the upper electrode 45 and part of the individual trace portion 52 are placed on the upper surface of the second piezoelectric body 44. In that configuration, the upper electrode 45 and the individual trace portions 52 that are not conducted with each other are easily formed by forming the conductive bodies on the upper surface of the second piezoelectric bodies 44 and then forming the slits 57.

In this embodiment, the slit 57 is positioned inside the first piezoelectric body 42 and the second piezoelectric body 44 from the slit 56 in the conveyance direction. Thus, an end at the first side in the conveyance direction of the portion (active portion) of the first piezoelectric body 42 interposed between the lower electrode 41 and the intermediate electrode 43 overlaps in the thickness direction with a portion (non-active portion) of the second piezoelectric body 44 not interposed between the intermediate electrode 43 and the upper electrode 45. The deformation of the vibration plate 40 and the ends at the first side in the conveyance direction of the first piezoelectric body 42 and the second piezoelectric body 44 is thus inhibited at the time of driving of the piezoelectric actuator 33. The first piezoelectric body 42 and the second piezoelectric body 44 are not likely to crack.

In order to inhibit the first piezoelectric body 42 and the second piezoelectric body 44 from being cracked, the position in the conveyance direction of the slit 56 and the position in the conveyance direction of the slit 57 may be reversed to those in this embodiment.

When the position in the conveyance direction of the slit 56 and the position in the conveyance direction of the slit 57 are reversed to those in this embodiment, the length in the conveyance direction of the first piezoelectric body 42 interposed between the lower electrode 41 and the intermediate electrode 43 and the length in the conveyance direction of the portion of the second piezoelectric body 44 interposed between the intermediate electrode 43 and the upper electrode 45 are reversed to those in this embodiment. The end at the first side in the conveyance direction of the portion (active portion) of the second piezoelectric body 44 interposed between the upper electrode 45 and the intermediate electrode 43 overlaps in the thickness direction with a portion (non-active portion) of the first piezoelectric body 42 not interposed between the intermediate electrode 43 and the lower electrode 41. The deformation of the vibration plate 40 and the ends at the first side in the conveyance direction of the first piezoelectric body 42 and the second piezoelectric body 44 is thus inhibited at the time of driving of the piezoelectric actuator 33. The first piezoelectric body 42 and the second piezoelectric body 44 are not likely to crack.

When the configuration in this embodiment is compared to the configuration in which the position in the conveyance direction of the slit 56 and the position in the conveyance direction of the slit 57 are reversed to those in this embodiment, the deformation amount of each of the vibration plate 40, the first piezoelectric body 42, and the second piezoelectric body 44 (the amount of change in the volume of the pressure chamber 30) at the time of driving the piezoelectric actuator 33 in this embodiment is larger than that of the configuration in which the position in the conveyance direction of the slit 56 and the position in the conveyance direction of the slit 57 are reversed to those in this embodiment, as understood from Example and Comparative Example described below. That is why the slit 57 is positioned inside the first piezoelectric body 42 and the second piezoelectric body 44 from the slit 56 in the conveyance direction in this embodiment.

In this embodiment, the individual trace portions 50 to 52 connected to the intermediate electrodes 43 are drawn out to the first side in the conveyance direction. The common trace portions 46 and 47 connected to the lower electrode 41 and the upper electrode 45 are drawn out to the second side in the conveyance direction. Namely, the individual trace portions 50 to 52 and the common trace portions 46 and 47 are drawn out to the opposite sides in the conveyance direction. This inhibits a short circuit between the individual trace portions 50 to 52 connected to the intermediate electrodes 43 of which electric potential is switched between the ground potential and the driving potential and the common trace portions 46 and 47 connected to the lower electrode 41 and the upper electrode 45 kept at the ground potential.

There may be a configuration, different from this embodiment, in which the second piezoelectric body 44 covers the end surfaces 42a in the width direction of the first piezoelectric body 42. In that case, portions covering the end surfaces 42a of the second piezoelectric body 44 are non-active portions that are not interposed between the intermediate electrode 43 and the upper electrode 45. The non-active portions obstruct the deformation at the time of driving of the piezoelectric actuator 33. Variation in thickness of the portions included in the second piezoelectric body 44 and covering the end surfaces 42a of the first piezoelectric body 42 changes deformation characteristics of the piezoelectric actuator 33.

On the other hand, in this embodiment, the ends in the width direction of the second piezoelectric body 44 are positioned between the both ends in the width direction of the first piezoelectric body 42. The second piezoelectric body 44 does not cover the end surfaces 42a of the first piezoelectric body 42. This stabilizes the deformation characteristics of the piezoelectric actuator 33 when compared to the above configuration different from this embodiment.

In this embodiment, the second piezoelectric body 44 extends to the end at the first side in the conveyance direction of the first piezoelectric body 42. In that configuration, the entirety of the portion included in the individual trace portion 51 and disposed on the upper surface of the first piezoelectric body 42 is covered with the second piezoelectric body 44. The individual trace portion 51 is thus not likely to be removed when the second piezoelectric body 44 is formed through etching.

In this embodiment, the length L2 in the conveyance direction of the second piezoelectric body 44 is longer than the length L1 in the conveyance direction of the first piezoelectric body 42. The second piezoelectric body 44 covers the end surfaces 42a in the conveyance direction of the first piezoelectric body 42. This inhibits a short circuit between the end in the conveyance direction of the intermediate electrode 43 and the upper electrode 45.

In this embodiment, as depicted in FIG. 10D, the lamination boundary 111 of the first piezoelectric body 42 extends in the conveyance direction, whereas part of the lamination boundary 112 included in the second piezoelectric body 44 and covering the end surface 42a in the conveyance direction of the first piezoelectric body 42 is inclined to the conveyance direction.

As depicted in FIG. 3. in this embodiment, the both ends in the width direction of the individual trace portion 50 are positioned between the both ends in the width direction of the individual trace portion 51. The both ends in the width direction of the individual trace portion 51 are positioned between the both ends in the width direction of the individual trace portion 52. The individual trace portion 51 thus covers the entire length in the width direction of the individual trace portion 50, and the individual trace portion 52 covers the entire length in the width direction of the individual trace portion 51. In that configuration, the individual trace portions 50 to 52 reliably overlap with each other in the up-down direction and are conducted with each other, even when the individual trace portions 50 to 52 are shifted in the width direction owing to an error at the time of forming the individual trace portions 50 to 52 that may be caused by etching accuracy at the time of manufacturing the piezoelectric actuator 33, and the like.

There may be a configuration, different from this embodiment, as depicted in FIG. 11. In the configuration of FIG. 11, a slit 56' positioned between a lower electrode 41' and an individual trace portion 50' is partially positioned outside the first piezoelectric body 42 in the conveyance direction, and an end at a lower electrode 41' side in the conveyance direction of the individual trace portion 50' does not overlap in the up-down direction with the first piezoelectric body 42. In that configuration, the individual trace portions 51 and 52 positioned outside the first piezoelectric body 42 and the second piezoelectric body 44 in the conveyance direction do not partially overlap with the individual trace portion 50' in the up-down direction. The thickness of this portion of the trace is thus thin (the thickness corresponds to the total of the thicknesses of the individual trace portions 51 and 52). The thin portion is thus likely to be broken.

In this embodiment, the end at the lower electrode 41 side in the conveyance direction of the individual trace portion 50 overlaps in the up-down direction with the first piezoelectric body 42. In that configuration, as depicted in FIG. 6, the entire length in the conveyance direction of the individual trace portions 50 to 52 overlap with each other in the up-down direction at the first side in the conveyance direction from the first piezoelectric body 42 and the second piezoelectric body 44. This reliably inhibits the disconnection of the trace connected to the intermediate electrode 43.

In this embodiment, the thickness T3 of the intermediate electrode 43 and the individual trace portion 51 is smaller than the thickness T1 of the lower electrode 41 and the individual trace portion 50 and the thickness T2 of the upper electrode 45 and the individual trace portion 52. The intermediate electrode 43 having a small thickness is easily deformed by following the deformation of the first piezoelectric body 42 and the second piezoelectric body 44, which makes it difficult to apply stress to the intermediate electrode 43. This inhibits delamination between the first piezoelectric body 42 and the second piezoelectric body 44. Inhibiting the disconnection by overlapping the individual trace portion 51 having a small thickness with the individual trace portions 50 and 52 to form a trace having a large thickness is meaningful in that configuration.

In this embodiment, the thickness of the electrodes 41, 43, and 45 as well as the thickness of the individual trace portions 50 to 52 are not less than 0.05 µm and not more than 0.2 µm, which are thin. Thus, inhibiting the disconnection by overlapping the individual trace portions 50 and 52 with each other in the up-down direction to form a trace having a large thickness is meaningful in that configuration.

EXAMPLE

Figure 12A:
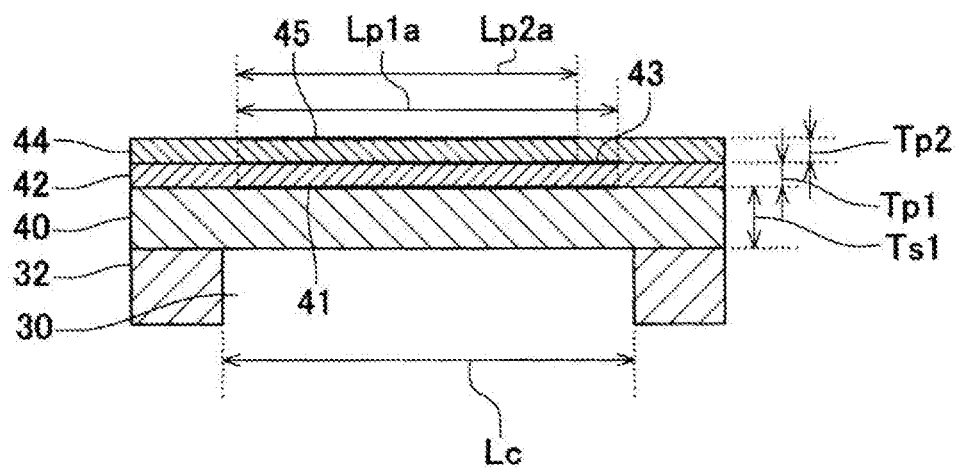
FIG. 12A depicts an analysis model of a head unit according to an example of the present disclosure and FIG. 12B depicts an analysis model of a head unit according to a comparative example.
Figure 12B:
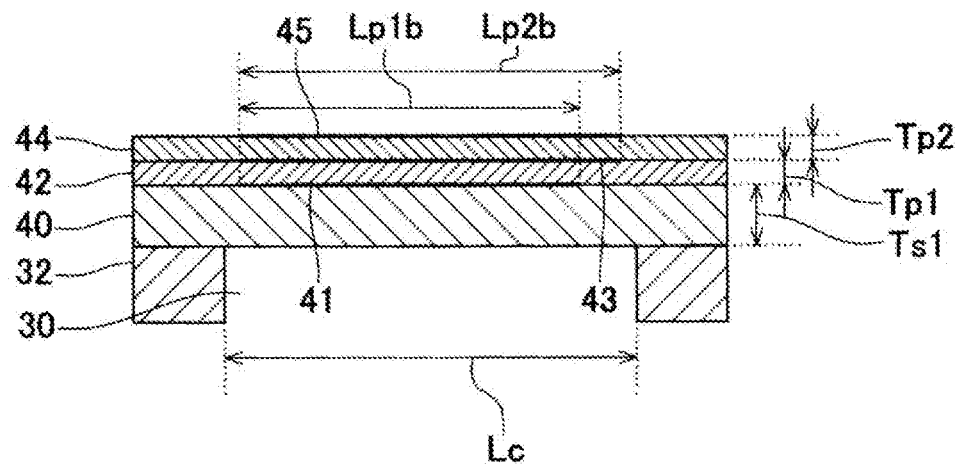

Example of the present disclosure is explained below. FIG. 12A is an analysis model of a cross-section of a portion around the pressure chamber 30 and the piezoelectric actuator 33 according to Example corresponding to this embodiment. FIG. 12B is an analysis model, corresponding to FIG. 12A, of an example (hereinafter referred to as Comparative Example) in which the position of the slit 56 and the position of the slit 57 are reversed to this embodiment.

In Example and Comparative example, the pressure chamber 30 had a length Lc of 500 µm. In Example and Comparative Example, the vibration plate 40 had a Young modulus of 70 GPa, and the vibration plate 40 had a thickness Ts of 2.5 µm. In Example and Comparative Example, the first piezoelectric body 42 had a thickness Tp1 of 1 µm, and the second piezoelectric body 44 had a thickness Tp2 of 1 µm.

In Example, a first active portion had a length Lp1a of 450 µm, and a second active portion had a length Lp2a of 420 µm. In Comparative Example, the first active portion had a length Lp1b of 420 µm, and the second active portion had a length Lp2b of 450 µm, which are reversed to Example.

In Example and Comparative example, the maximum deformation amount of each of the vibration plate 40, the first piezoelectric body 42, and the second piezoelectric body 44 was analyzed using the above analysis model, when the lower electrode 41 and the upper electrode 45 were kept at the ground potential and the piezoelectric actuator 33 was driven by applying positive potential to the intermediate electrode 43. According to the analysis results, the maximum deformation amount in Example was larger than Comparative Example.

Modified Embodiment

The embodiment of the present disclosure is explained above. The present disclosure, however, is not limited to the above embodiment. Various changes or modifications may be made without departing from the claims.

In the above embodiment, the thickness of the electrodes 41, 43, and 45 and the thickness of the individual trace portions 50 to 52 are not less than 0.05 µm and not more than 0.2 µm. The present disclosure, however, is not limited thereto. The thickness of at least some of the electrodes 41, 43, and 45 and the thickness of individual trace portion(s) included in the individual trace portions 50 to 52 and corresponding to the at least some of the electrodes 41, 43, and 45 may be smaller than 0.05 µm or larger than 0.2 µm.

In the above embodiment, the thickness T3 of the intermediate electrode 43 and the individual trace portion 51 is smaller than the thickness T1 of the lower electrode 41 and the individual trace portion 50 and the thickness T2 of the upper electrode 45 and the individual trace portion 52. The present disclosure, however, is not limited thereto. The thickness T3 may be larger than the thicknesses T1 and T2.

In the above embodiment, the end at the lower electrode 41 side in the conveyance direction of the individual trace portion 50 overlaps in the up-down direction with the first piezoelectric body 42. The present disclosure, however, is not limited thereto. For example, as depicted in FIG. 11, at least part of the slit 56 may extend beyond the first piezoelectric body 42 at the first side in the conveyance direction so that the end at the lower electrode 41 side in the conveyance direction of the individual trace portion 50 does not overlap in the up-down direction with the first piezoelectric body 42.

In the above embodiment, the length Wk2 in the width direction of the individual trace portion 51 is longer than the length Wk1 in the width direction of the individual trace portion 50. The both ends in the width direction of the individual trace portion 50 are positioned between the both ends in the width direction of the individual trace portion 51. Further, the length Wk3 in the width direction of the individual trace portion 52 is longer than the length Wk2 in the width direction of the individual trace portion 51. The both ends in the width direction of the individual trace portion 51 are positioned between the both ends in the width direction of the individual trace portion 52. The present disclosure, however, is not limited thereto. The lengths and positions in the width direction of the individual trace portions 50 to 52 may be different from the above. For example, the individual trace portions 50 to 52 may have the same length in the width direction, and the both ends in the width direction of the individual trace portions 50 to 52 may have the same position.

In the above embodiment, the second piezoelectric body 44 covers the end surfaces 42*b* in the conveyance direction of the first piezoelectric body 42. The present disclosure, however, is not limited thereto. In the modified embodiment, the length in the conveyance direction of the second piezoelectric body 44 may be shorter than the above embodiment, and the second piezoelectric body 44 may not cover at least one of the end surfaces 42*b* in the conveyance direction of the first piezoelectric body 42.

In the modified embodiment, the length in the conveyance direction of the second piezoelectric body 44 may be shorter than the length in the conveyance direction of the first piezoelectric body 42, and the second piezoelectric body 44 may not cover the end surfaces 42*b* of the first piezoelectric body 42.

In the above embodiment, the length W2 in the width direction of the second piezoelectric body 44 is shorter than the length W1 in the width direction of the first piezoelectric body 42. The end surfaces 42*a* in the width direction of the first piezoelectric body 42 are not covered with the second piezoelectric body 44. The present disclosure, however, is not limited thereto.

Figure 13:
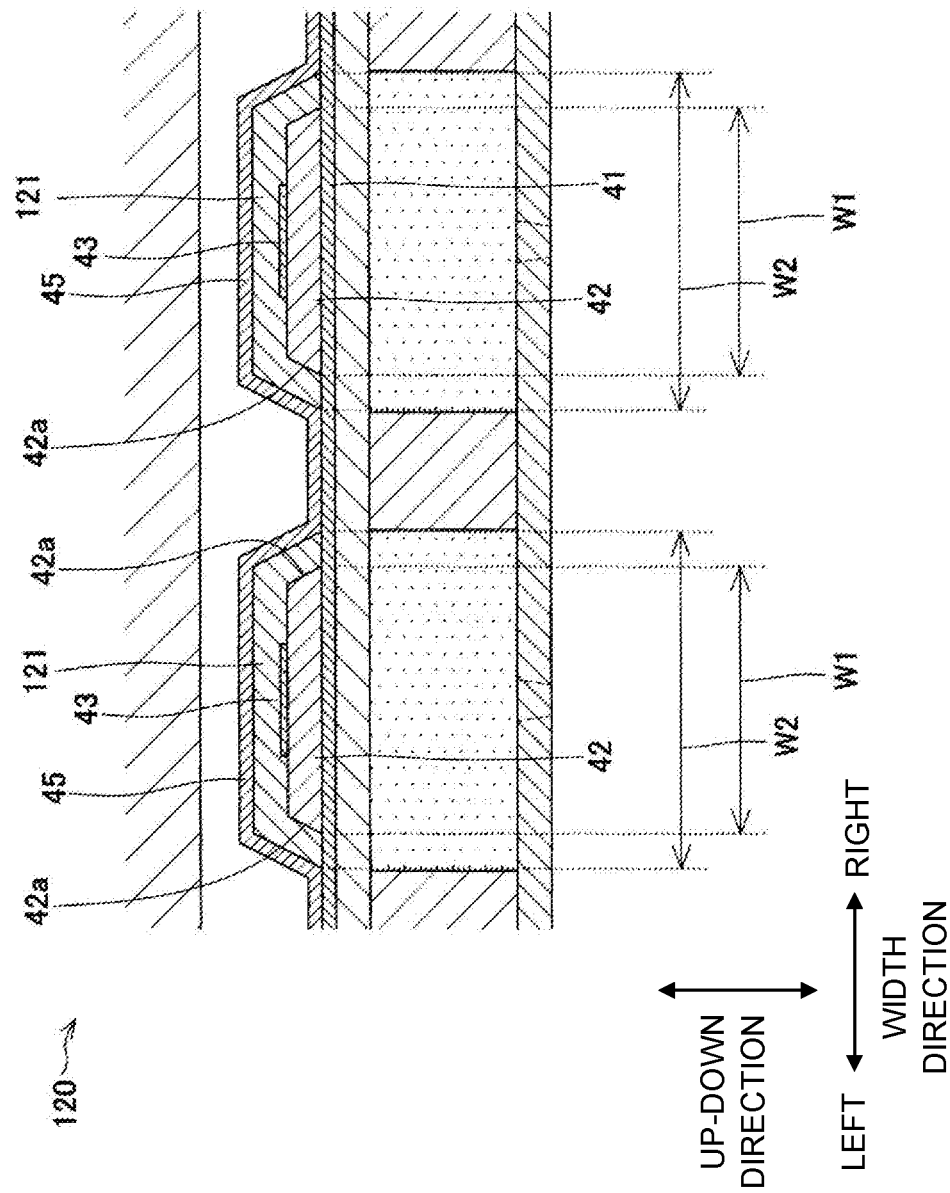
FIG. 13 depicts a head unit 120 and corresponds to FIG. 5.

In a head 120 of the first modified embodiment, as depicted in FIG. 13, a length W2 in the width direction of a second piezoelectric body 121 is longer than a length W1 in the width direction of the first piezoelectric body 42, and the second piezoelectric body 121 covers the end surfaces 42*a* in the width direction of the first piezoelectric body 42.

Figure 14:
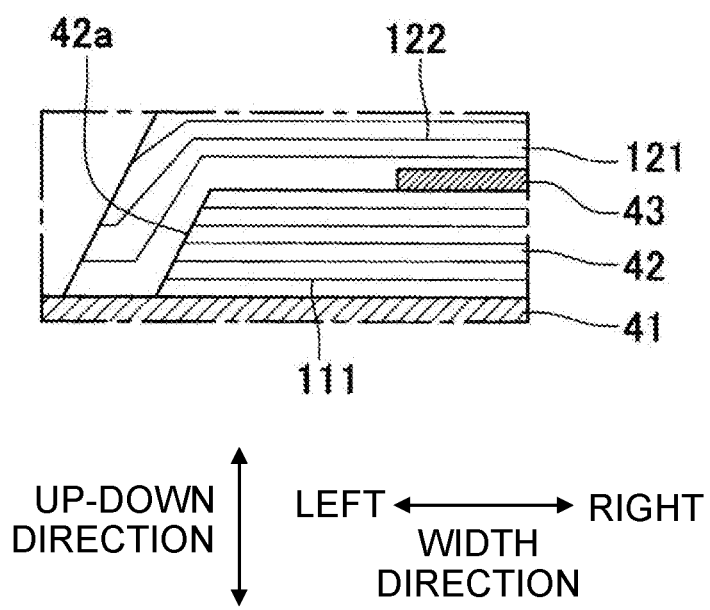
FIG. 14 depicts the head unit 120 and corresponds to FIG. 9D.

In the above configuration, as depicted in FIG. 14, a portion that is included in a lamination boundary 122 of the second piezoelectric body 121 formed in baking by the sol-gel method and that overlaps in the up-down direction with the first piezoelectric body 42 extends in the width direction. A portion that is included in the lamination boundary 122 and that covers the end surface 42*a* in the width direction of the first piezoelectric body 42 is inclined to the width direction.

In the first modified embodiment, the second piezoelectric body 121 covers the end surfaces 42*a* in the width direction of the first piezoelectric body 42. This inhibits a short circuit between the end in the width direction of the intermediate electrode 43 and the upper electrode 45.

In the first modified embodiment, the end surfaces 42*a* in the width direction of the first piezoelectric body 42 are covered with the second piezoelectric body 44. However, only one of the end surfaces 42*a* in the width direction of the first piezoelectric body 42 may be covered with the second piezoelectric body 44.

The relationship between the length in the width direction of the first piezoelectric body 42 and the length in the width direction of the second piezoelectric body 44 is not limited to the above embodiment and the first modified embodiment. For example, the length in the width direction of the upper surface of the first piezoelectric body 42 may be the same as the length in the width direction of the lower surface of the second piezoelectric body 44. The positions of the ends in the width direction of the upper surface of the first piezoelectric body 42 may be the same as the positions of the ends in the width direction of the upper surface of the second piezoelectric body 44.

In the above embodiment, the individual trace portions 50 to 52 connected to the intermediate electrode 43 and the common trace portions 46 and 47 connected to the lower electrode 41 and the upper electrode 45 are drawn to the opposite sides in the conveyance direction. The present disclosure, however, is not limited thereto. The individual trace portions 50 to 52 and the common trace portions 46 and 47 may be drawn to the same side in the conveyance direction. In that case, for example, an insulating film may be disposed between the individual trace portions 50 to 52 and the common trace portions 46 and 47 in the up-down direction.

In the above embodiment, the center portion of the slit 56 is positioned inside the first piezoelectric body 42 from the center portion of the slit 57 in the conveyance direction. The present disclosure, however, is not limited thereto.

Figure 15:
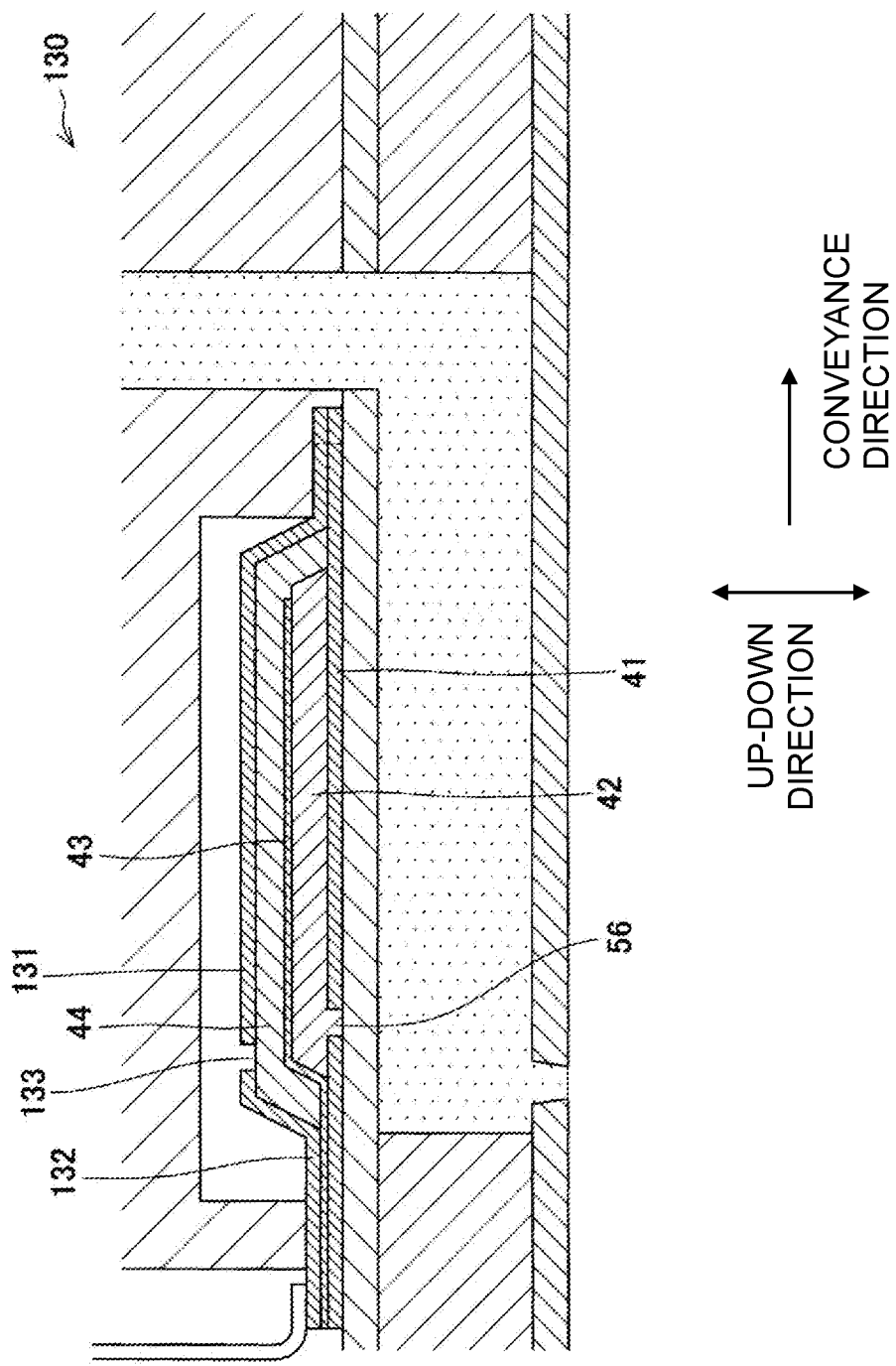
FIG. 15 depicts a head unit 130 and corresponds to FIG. 6.

In a head unit 130 of the second modified embodiment, as depicted in FIG. 15, the position of the slit 56 is the same as the above embodiment. However, in the second modified embodiment, a center portion of a slit 133 between an upper electrode 131 and an individual trace portion 132 is positioned outside the first piezoelectric body 42 and the second piezoelectric body 44 from the center portion of the slit 56 in the conveyance direction.

In the second modified embodiment, the length in the conveyance direction of the portion (active portion) of the first piezoelectric body 42 interposed between the lower electrode 41 and the intermediate electrode 43 is shorter than the length in the conveyance direction of the portion (active portion) of the second piezoelectric body 44 interposed between the intermediate electrode 43 and the upper electrode 131. This inhibits a crack in the portions of the first piezoelectric body 42 and the second piezoelectric body 44 overlapping in the up-down direction with the ends in the conveyance direction of the pressure chamber 30.

Alternatively, the position of a center portion in the conveyance direction of a slit separating the lower electrode from the individual trace portion may be the same as the position of a center portion of a slit separating the upper electrode from the individual trace portion.

In the above embodiment, the individual trace portion 50 has the portion overlapping in the up-down direction with the first piezoelectric body 42, and the individual trace portion 52 has the portion disposed on the upper surface of the second piezoelectric body 44. The present disclosure, however, is not limited thereto.

Figure 16:
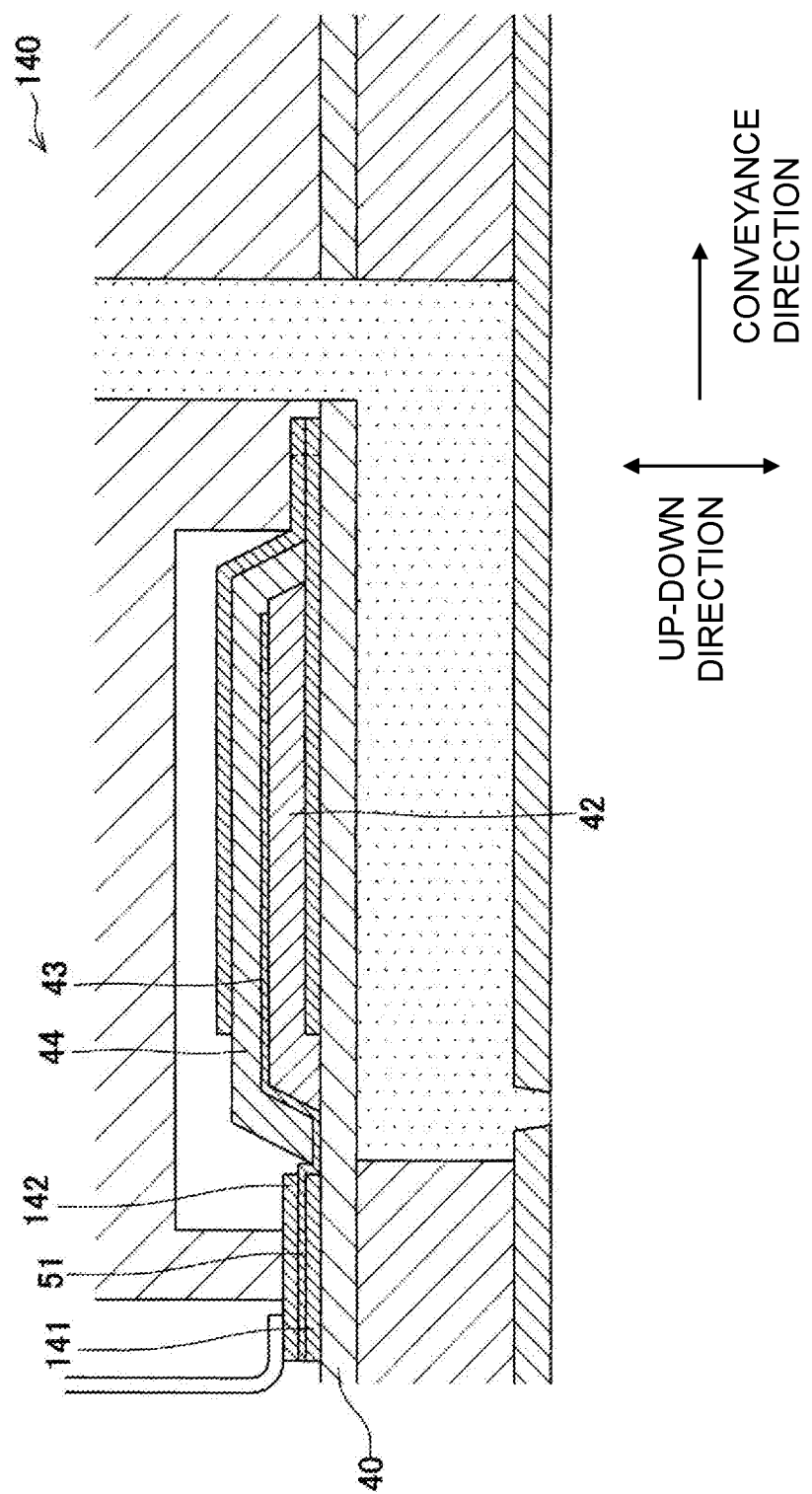
FIG. 16 depicts a head unit 140 and corresponds to FIG. 6.

In a head unit 140 of the third modified embodiment, as depicted in FIG. 16, individual trace portions 141 and 142 are provided instead of the individual trace portions 50 and 52 in the head unit 11. An end at the lower electrode 41 side in the conveyance direction of the individual trace portion 141 is positioned outside the first piezoelectric body 42 and the second piezoelectric body 44 in the conveyance direction. The individual trace portion 141 thus does not overlap in the up-down direction with the first piezoelectric body 42 and the second piezoelectric body 44. Further, an end at the upper electrode 45 side in the conveyance direction of the individual trace portion 142 is positioned outside the first piezoelectric body 42 and the second piezoelectric body 44 in the conveyance direction. The individual trace portion 142 thus has no portion positioned on the upper surface of the second piezoelectric body 44.

Also in the third modified embodiment, the individual trace portion 51 connected to the intermediate electrode 43 overlaps in the up-down direction with the individual trace portions 141 and 142 at a portion of the upper surface of the vibration plate 40 outside the first piezoelectric body 42 and the second piezoelectric body 44 in the conveyance direction and are conducted therewith. This makes the thickness of the trace connected to the intermediate electrode 43 large, inhibiting disconnection.

In the above embodiment, the lower electrode 41 disposed between the vibration plate 40 and the first piezoelectric body 42 as well as the upper electrode 45 disposed on the upper surface of the second piezoelectric body 44 are electrodes kept at the ground potential. The intermediate electrode 43 disposed between the first piezoelectric body 42 and the second piezoelectric body 44 is an electrode of which electric potential is switched between the ground potential and the driving potential. The present disclosure, however, is not limited thereto. For example, individual lower electrodes may be provided between the vibration plate 40 and the respective first piezoelectric bodies 42, and individual upper electrodes may be provided on the upper surfaces of the respective second piezoelectric bodies 44. The intermediate electrodes may be electrodes kept at the ground potential, and the lower electrodes and the upper electrodes may be electrodes of which electric potential is switched between the ground potential and the driving potential. In that case, one intermediate electrode may be provided to continuously extend over the first piezoelectric bodies 42 and the second piezoelectric bodies 44.

In the above example(s), the length in the conveyance direction of each of the first piezoelectric body 42 and the second piezoelectric body 44 is longer than the length in the width direction thereof. The common trace portions 46, 47 and the individual trace portions 50 to 52 are drawn out in the conveyance direction. The present disclosure, however, is not limited thereto. For example, the common trace portions and the individual trace portions may be drawn out in the width direction. In that case, the width direction corresponds to a first direction of the present disclosure, and the conveyance direction corresponds to a second direction of the present disclosure.

In the above embodiment(s) and example(s), the traces connected to the intermediate electrodes 43 are formed by three individual trace portions that overlap with each other in the up-down direction and conducted with each other. The present disclosure, however, is not limited thereto.

As depicted in FIG. 17A, a head unit 150 of the fourth modified embodiment includes common trace portions 151 in addition to the configuration similar to the head unit 11. The common trace portions 151 correspond to the respective pressure chambers 30. The common trace portion 151 is placed on the upper surface of the first piezoelectric body 42 at a portion overlapping with the end at the second side in the conveyance direction of the pressure chamber 30. The common trace portion 151 is positioned at the second side in the conveyance direction from the intermediate electrode 43. The common trace portion 151 extends toward the second side in the conveyance direction from the upper surface of the first piezoelectric body 42 to the upper surface of the vibration plate 40 beyond the first piezoelectric body 42. The common trace portion 151 disposed on the upper surface of the vibration plate 40 is interposed between the common trace portion 46 and the common trace portion 47. This allows the common trace portions 46, 47 and the common trace portion 151 to overlap with each other in the up-down direction and to be conducted with each other.

Further, the head unit 150 further includes a coupling trace portion 152 that is connected to an end in the conveyance direction at the opposite side of the intermediate electrode 43 of the common trace portion 151. The coupling trace portion 152 is disposed between the coupling trace portions 48 and 49 in the up-down direction.

In the fourth modified embodiment, the traces connected to the lower electrode 41 and the upper electrode 45 are thicker than the above embodiment. This reliably inhibits the disconnection of the traces connected to the lower electrode 41 and the upper electrode 45.

In the fourth modified embodiment, similar to the above embodiment, the individual trace portion 50 corresponds to the first trace portion of the present disclosure, the individual trace portion 51 corresponds to the intermediate trace portion of the present disclosure, and the individual trace portion 52 corresponds to the second trace portion of the present disclosure. Further, the common trace portion 46 corresponds to the first trace portion of the present disclosure, the common trace portion 47 corresponds to the second trace portion of the present disclosure, and the common trace portion 151 corresponds to the intermediate trace portion of the present disclosure.

In the fourth modified embodiment, similar to the above embodiment, the head unit 150 includes the individual trace portions 50 and 52, and the individual trace portions 50, 51, and 52 overlap with each other in the up-down direction and conducted with each other. The present disclosure, however, is not limited thereto. The head unit 150 of the fourth modified embodiment may not include the individual trace portions 50 and 52.

In the above embodiment, the lower electrode 41 extends in the width direction over the first piezoelectric bodies 42 corresponding to the pressure chamber row 8, and the upper electrode 45 extends in the width direction over the second piezoelectric bodies 44 corresponding to the pressure chamber row 8. The present disclosure, however, is not limited thereto. For example, in a head unit 160 of the fifth modified embodiment, as depicted in FIGS. 18A and 18B, individual lower electrodes 161 are disposed between the respective first piezoelectric bodies 42 and the vibration plate 40. Individual upper electrodes 162 are disposed on upper surfaces of the respective piezoelectric bodies 44.

In the fifth modified embodiment, the individual lower electrodes 161 correspond to the respective first piezoelectric bodies 42, and the individual upper electrodes 162 correspond to the respective second piezoelectric bodies 44. The present disclosure, however, is not limited thereto. For example, the individual lower electrodes 161 may correspond to the respective first piezoelectric bodies 42 similar to the fifth modified embodiment, and the upper electrode 45, which extends in the width direction over the second piezoelectric bodies 44 corresponding to the pressure chamber row 8, may be provided similarly to the above embodiment. Or, the lower electrode 41, which extends in the width direction over the first piezoelectric bodies 42 corresponding to the pressure chamber row 8, may be provided similarly to the above embodiment, and the individual upper electrodes 162 may correspond to the respective second piezoelectric bodies 44 similar to the fifth modified embodiment.

The examples in which the present disclosure is applied to the piezoelectric actuator used in the head unit discharging ink from nozzles are explained above. The present disclosure, however, is not limited thereto. The present disclosure can be applied to a piezoelectric actuator used any other apparatus than the head unit.

What is claimed is:

1. A piezoelectric actuator, comprising:
   a vibration plate;
   a first piezoelectric body disposed on the vibration plate;
   a second piezoelectric body disposed on the first piezoelectric body at a side opposite to the vibration plate in a thickness direction of the vibration plate;
   a first electrode disposed on a first surface, of the first piezoelectric body, facing the vibration plate in the thickness direction;
   a second electrode disposed on a second surface of the second piezoelectric body and overlapping with the first electrode in the thickness direction, the second surface of the second piezoelectric body being at an opposite side of the first piezoelectric body in the thickness direction;
   an intermediate electrode disposed on an intermediate surface of the first piezoelectric body and overlapping in the thickness direction with the first and second electrodes, the intermediate surface of the first piezoelectric body facing the second piezoelectric body in the thickness direction;
   an intermediate trace connected to the intermediate electrode on the intermediate surface and drawn out to one side in a first direction, which is orthogonal to the thickness direction, beyond the first piezoelectric body and the second piezoelectric body;
   a first trace overlapping with the intermediate trace in the thickness direction at a position at the one side in the first direction with respect to the first piezoelectric body and the second piezoelectric body, and being conducted with the intermediate trace; and
   a second trace overlapping with the intermediate trace in the thickness direction at a position at the one side in the first direction with respect to the first piezoelectric body and the second piezoelectric body, and being conducted with the intermediate trace.

2. The piezoelectric actuator according to claim 1, wherein a length of the first piezoelectric body in the first direction is longer than a length of the first piezoelectric body in a second direction orthogonal to the thickness direction and the first direction, and
   a length of the second piezoelectric body in the first direction is longer than a length of the second piezoelectric body in the second direction.

3. The piezoelectric actuator according to claim 1, wherein the first electrode and the second electrode are constant potential electrodes kept at a predefined electrical potential, and
   the intermediate electrode is a driving electrode of which electrical potential is switchable.

4. The piezoelectric actuator according to claim 1, wherein the first trace is drawn out from a position included in the first surface and overlapping with the first piezoelectric body in the thickness direction to the one side in the first direction beyond the first piezoelectric body and the second piezoelectric body, the first trace overlapping with the intermediate trace in the thickness direction,
   the second trace is drawn out from the second surface to the one side in the first direction beyond the first piezoelectric body and the second piezoelectric body, the second trace overlapping with the intermediate trace in the thickness direction.

5. The piezoelectric actuator according to claim 4, wherein the first electrode and the first trace are formed of a first conductive body disposed on the first surface of the first piezoelectric body;
   wherein the second electrode and the second trace are formed of a second conductive body disposed on the second surface of the second piezoelectric body;
   wherein a first slit extending in a second direction is formed in the first conductive body so that the first slit divides the first electrode from the first trace; and
   wherein a second slit extending in a second direction is formed in the second conductive body so that the second slit divides the second from the second trace.

6. The piezoelectric actuator according to claim 5, wherein a center portion of the second slit is positioned inside the first piezoelectric body from a center portion of the first slit in the first direction.

7. The piezoelectric actuator according to claim 5, wherein a center portion of the second slit is positioned outside the first piezoelectric body from a center portion of the first slit in the first direction.

8. The piezoelectric actuator according to claim 1, further comprising:
   a third trace disposed on the first surface and connected to the first electrode;
   a fourth trace disposed on the second surface and connected to the second electrode,
   wherein the third trace is drawn out from the first electrode to the other side in the first direction, and the fourth trace is drawn out from the second electrode to the other side in the first direction.

9. The piezoelectric actuator according to claim 1, wherein both ends of the second piezoelectric body in the second direction are positioned between both ends of the first piezoelectric body in the second direction.

10. The piezoelectric actuator according to claim 1, wherein a length of the second piezoelectric body in the second direction is longer than a length of the first piezoelectric body in the second direction, and
    the second piezoelectric body covers both end surfaces of the first piezoelectric body in the second direction.

11. The piezoelectric actuator according to claim 10, wherein each of the first piezoelectric body and the second piezoelectric body has a plurality of piezoelectric thin films laminated;
    a lamination boundary between the piezoelectric thin films of the first piezoelectric body extends in the second direction;
    in a lamination boundary between the piezoelectric thin films of the second piezoelectric body,
       a portion covering a surface, of the first piezoelectric body, at an opposite side of the vibration plate extends in the second direction; and
       a portion covering an end surface, of the first piezoelectric body, in the second direction is inclined to the second direction so that a portion closer to an inside of the first piezoelectric body in the second direction is further away from the vibration plate in the thickness direction.

12. The piezoelectric actuator according to claim 1, wherein the second piezoelectric body extends in the first direction to an end at the one side of the first piezoelectric body.

13. The piezoelectric actuator according to claim 12, wherein a length of the second piezoelectric body in the first direction is longer than a length of the first piezoelectric body in the first direction, and
the second piezoelectric body covers both end surfaces of the first piezoelectric body in the first direction.

14. The piezoelectric actuator according to claim 13, wherein each of the first piezoelectric body and the second piezoelectric body has a plurality of piezoelectric thin films laminated;
a lamination boundary between the piezoelectric thin films of the first piezoelectric body extends in the first direction;
in a lamination boundary between the piezoelectric thin films of the second piezoelectric body,
a portion covering a surface, of the first piezoelectric body, at an opposite side of the vibration plate extends in the first direction; and
a portion covering an end surface, of the first piezoelectric body, in the first direction is inclined to the first direction so that a portion closer to an inside of the first piezoelectric body in the first direction is further away from the vibration plate in the thickness direction.

15. The piezoelectric actuator according to claim 1, wherein a length of the intermediate trace in the second direction is longer than a length of the first trace in the second direction, and both ends of the first trace in the second direction are positioned between both ends of the intermediate trace in the second direction, and
a length of the second trace in the second direction is longer than a length of the intermediate trace in the second direction, and both ends of the intermediate trace in the second direction are positioned between both ends of the second trace in the second direction.

16. The piezoelectric actuator according to claim 1, wherein an end, of the first trace, at a side of the first electrode in the first direction overlaps with the first piezoelectric body in the thickness direction.

17. The piezoelectric actuator according to claim 1, wherein a length of the intermediate electrode in the thickness direction is shorter than a length of each of the first electrode and the second electrode in the thickness direction.

18. The piezoelectric actuator according to claim 1, wherein lengths in the thickness direction of each of the first electrode, the second electrode, the intermediate electrode, the intermediate trace, the first trace, and the second trace are not less than 0.05 µm and not more than 0.2 µm.

* * * * *